United States Patent
Inagaki et al.

(10) Patent No.: US 7,507,913 B2
(45) Date of Patent: Mar. 24, 2009

(54) MULTILAYER PRINTED WIRING BOARD

(75) Inventors: Yasushi Inagaki, Ibi-gun (JP);
Katsuyuki Sano, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 152 days.

(21) Appl. No.: 10/522,335

(22) PCT Filed: Mar. 24, 2003

(86) PCT No.: PCT/JP03/03561

§ 371 (c)(1),
(2), (4) Date: Jan. 25, 2005

(87) PCT Pub. No.: WO2004/015765

PCT Pub. Date: Feb. 19, 2004

(65) Prior Publication Data

US 2005/0236177 A1  Oct. 27, 2005

(30) Foreign Application Priority Data

Aug. 9, 2002 (JP) ............................. 2002-233775
Mar. 11, 2003 (JP) ............................. 2003-064986

(51) Int. Cl.
*H05K 1/16* (2006.01)
(52) U.S. Cl. .................................................. 174/260
(58) Field of Classification Search ................ 174/260; 324/691; 257/737
See application file for complete search history.

(56) References Cited

U.S. PATENT DOCUMENTS

| 2002/0027022 A1* | 3/2002 | Moriizumi ................... 174/267 |
| 2004/0026781 A1* | 2/2004 | Nakai ........................... 257/737 |
| 2004/0108862 A1* | 6/2004 | Azuma et al. ................ 324/691 |
| 2004/0173890 A1* | 9/2004 | Moriizumi ................... 257/686 |
| 2005/0236177 A1* | 10/2005 | Inagaki et al. ............... 174/255 |

FOREIGN PATENT DOCUMENTS

| EP | 1117283 | 7/2001 |
| JP | 06-260756 | 9/1994 |
| JP | 06-275959 | 9/1994 |
| JP | 2000-196234 | 7/2000 |
| JP | 2000-244130 | 9/2000 |
| JP | 2000-299404 | 10/2000 |

* cited by examiner

*Primary Examiner*—Jeremy C. Norris
*Assistant Examiner*—Abiy Getachew
(74) *Attorney, Agent, or Firm*—Oblon, Spivak, McClelland, Maier & Neustadt, P.C.

(57) ABSTRACT

A package substrate free of malfunction or error even with an IC chip in a high frequency range, particularly an IC chip with a frequency exceeding 3 GHz, is provided. A conductor layer 34P on a core substrate 30 is formed to have a thickness of 30 μm and a conductor circuit 58 on an interlayer resin insulating layer 50 is formed to have a thickness of 15 μm. By making the conductor layer 34P thick, it is possible to increase a volume of the conductor itself and decrease resistance. Further, by employing the conductor layer 34 as a power supply layer, it is possible to improve a capability of supplying power to the IC chip.

16 Claims, 29 Drawing Sheets

Fig.2
(A)
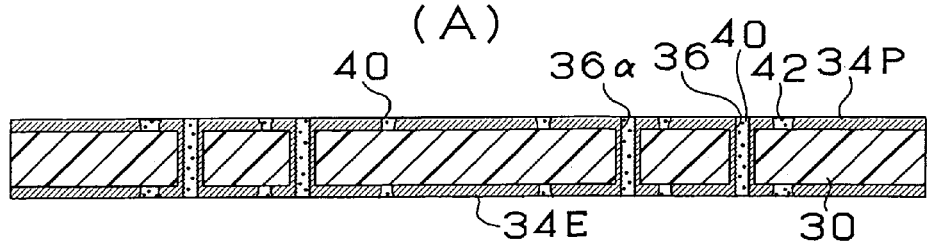
(B)
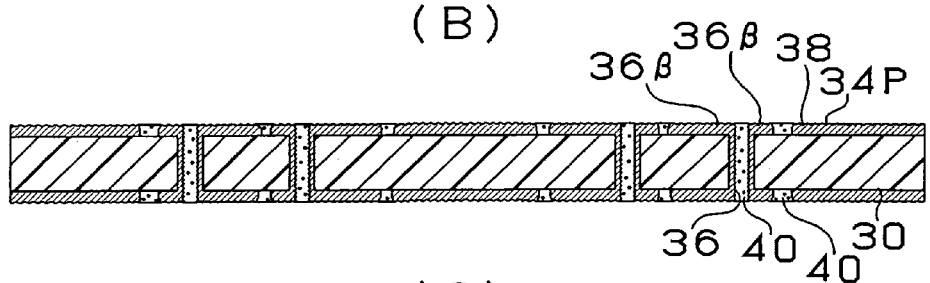
(C)
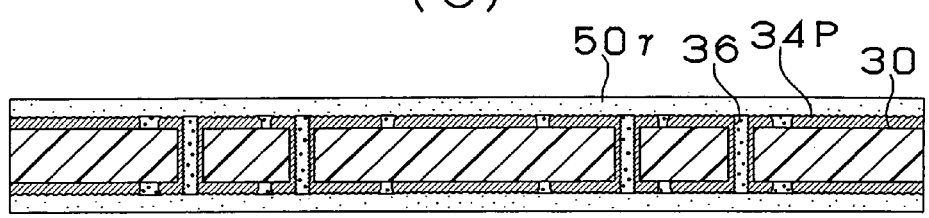
(D)
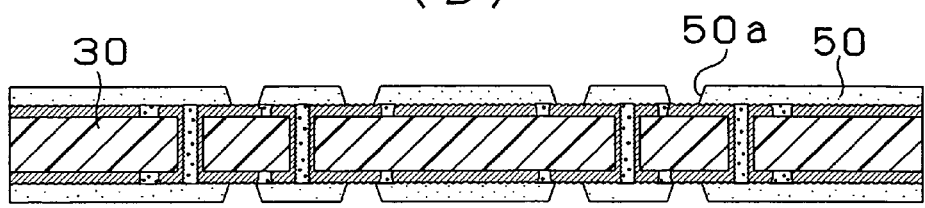
(E)
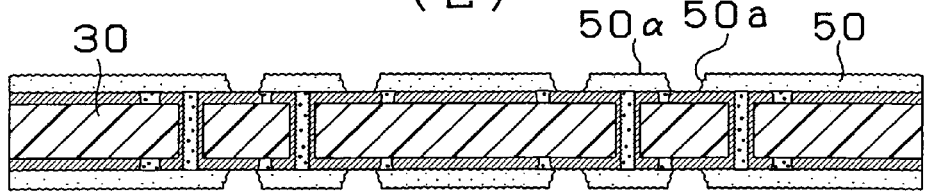

Fig. 3
(A)
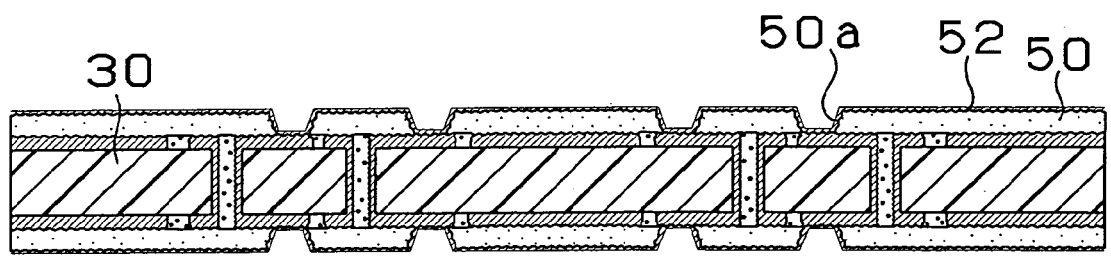
(B)
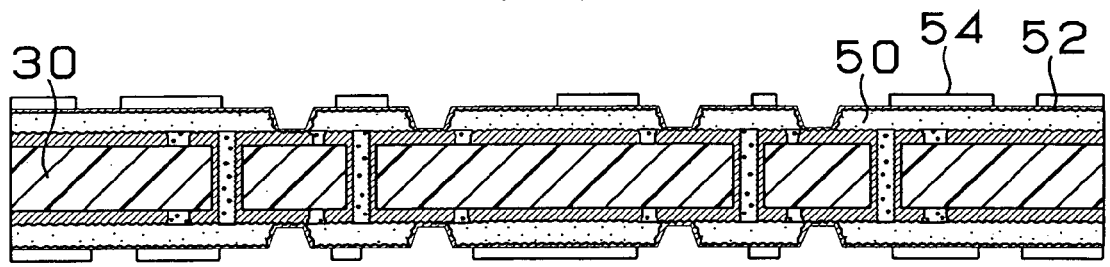
(C)
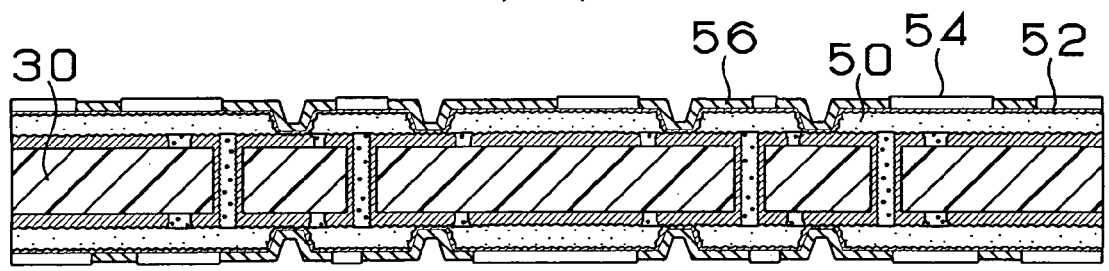
(D)
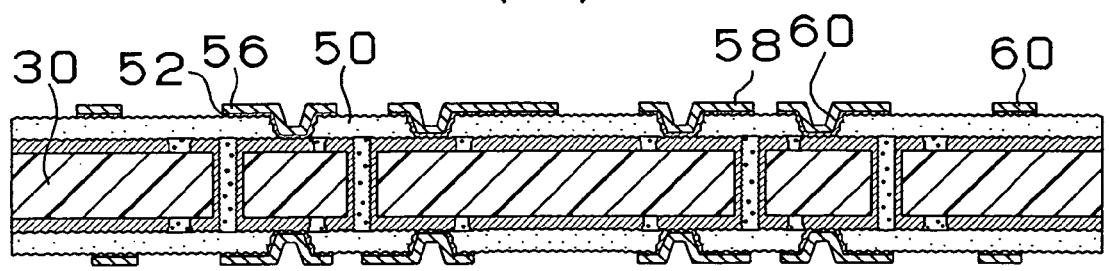

Fig.4
(A)
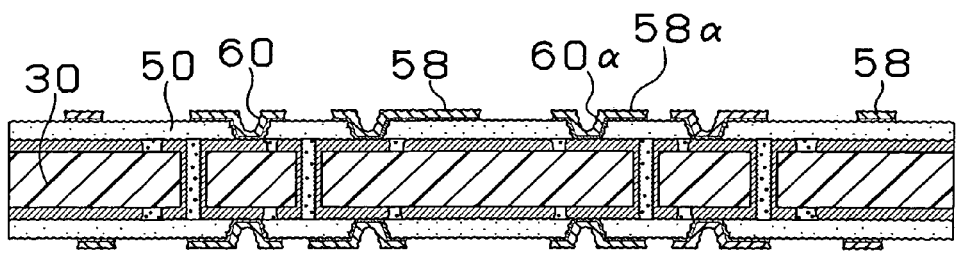
(B)
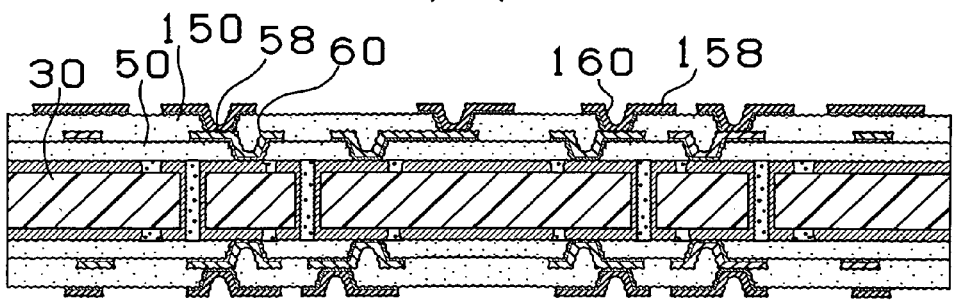
(C)
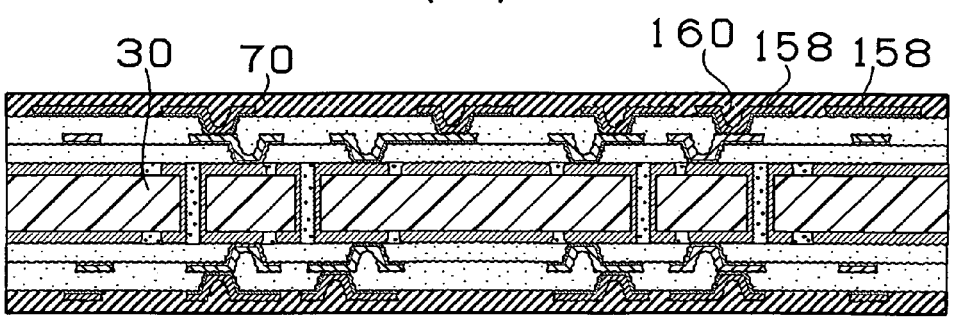

Fig.5
(A)
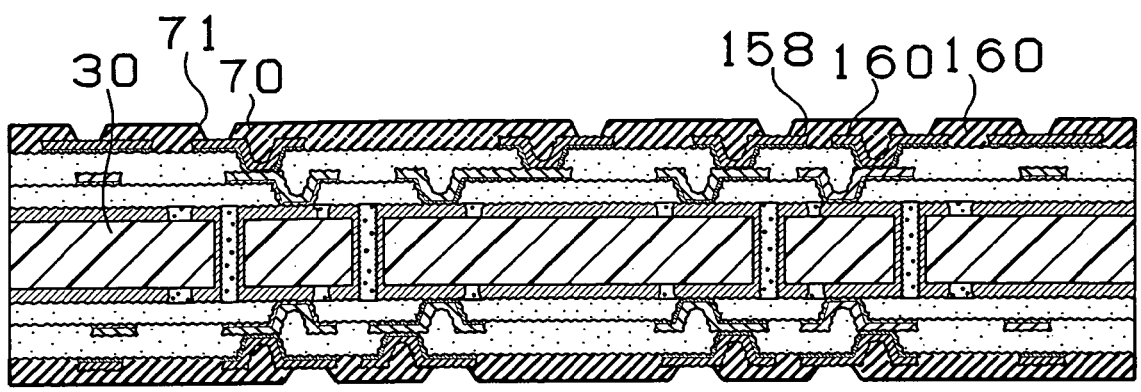
(B)
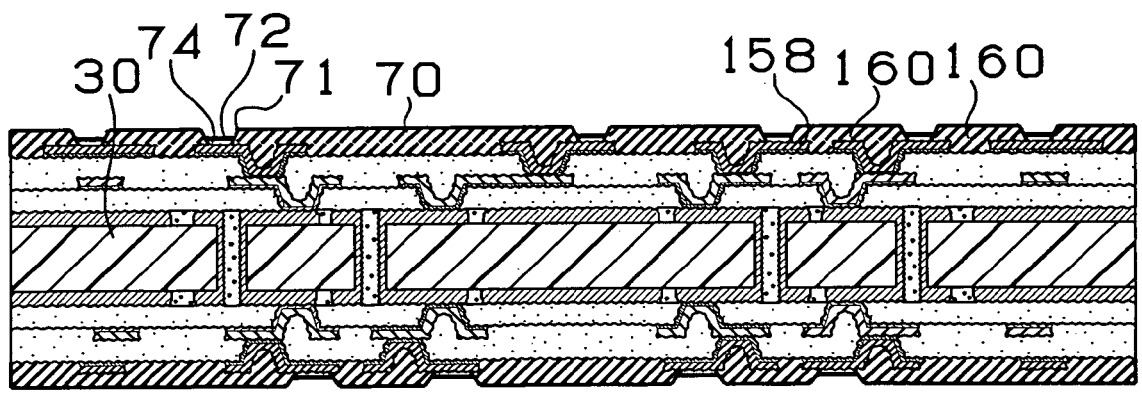

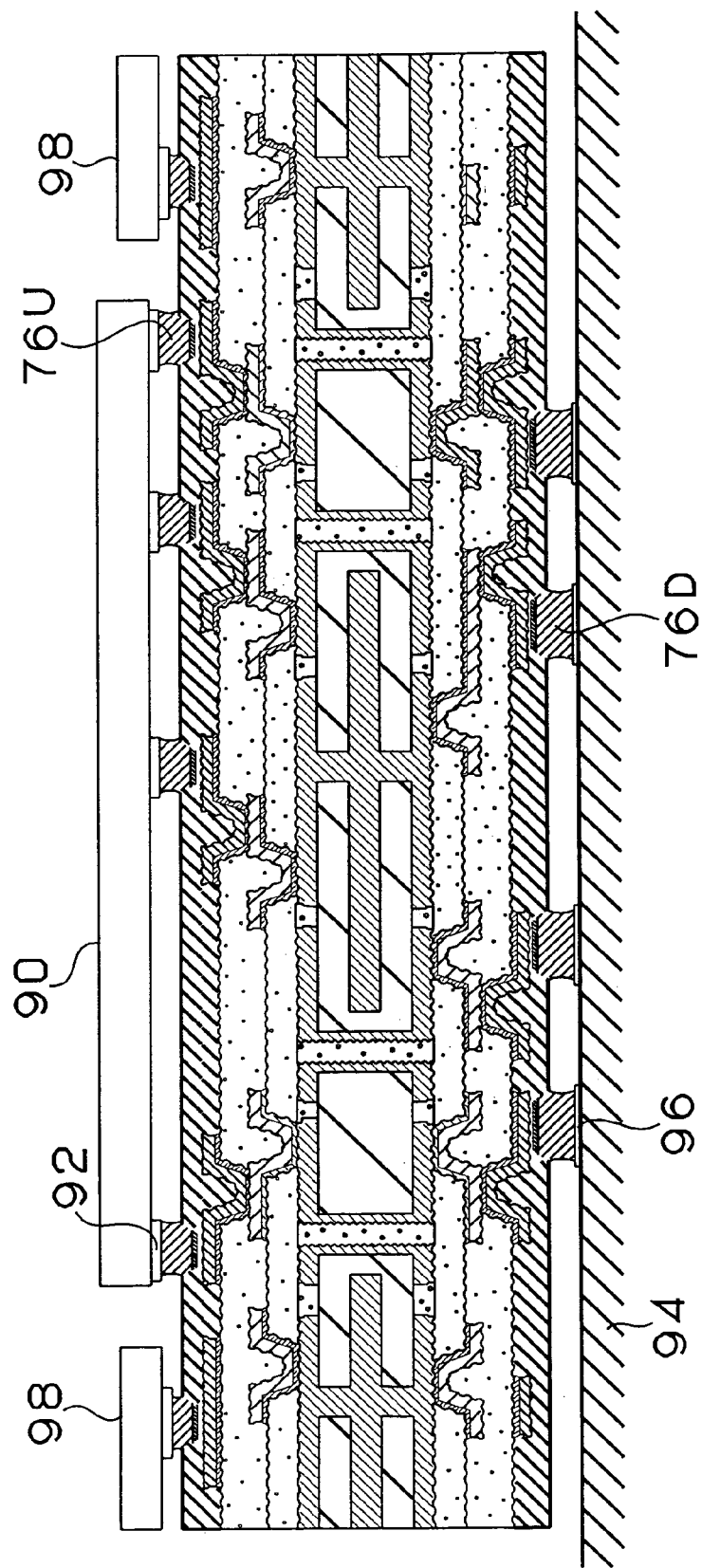

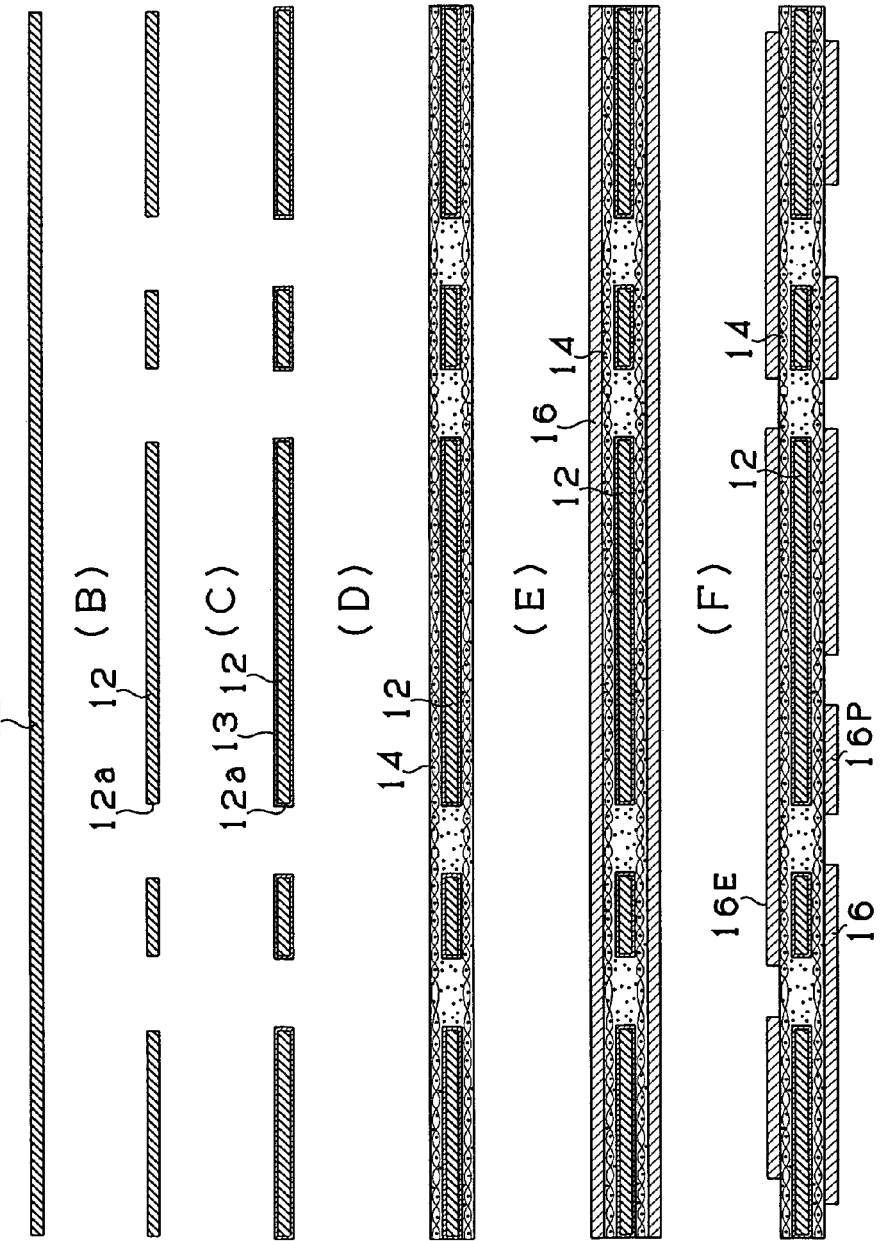

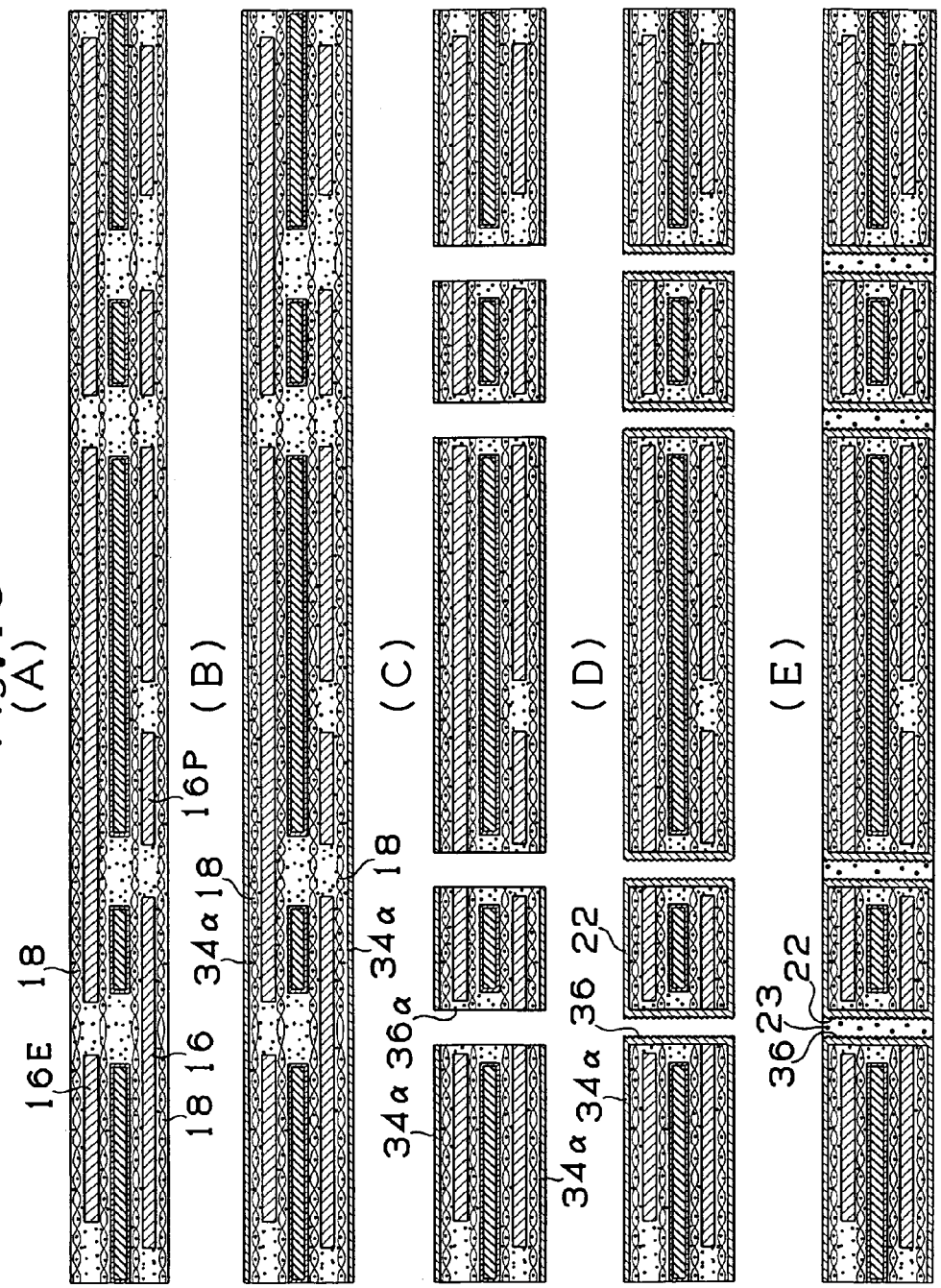

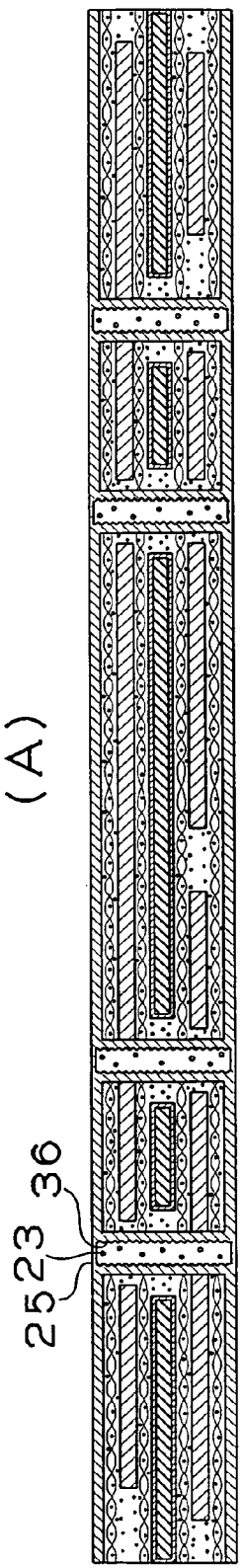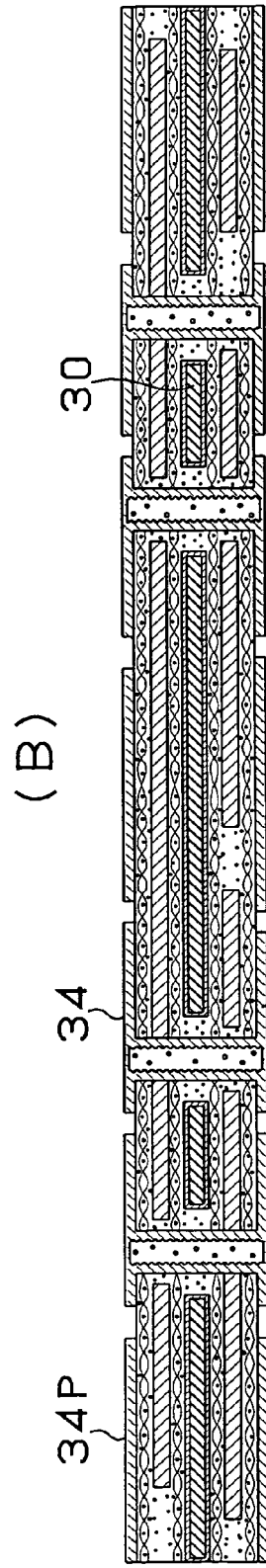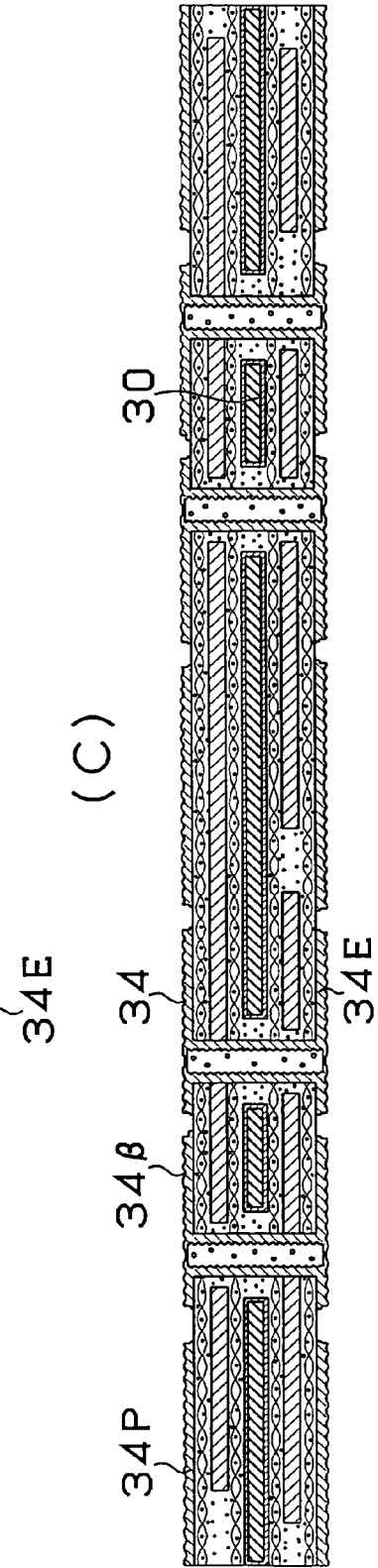
Fig.14 (A) (B) (C)

Fig.15
(A) 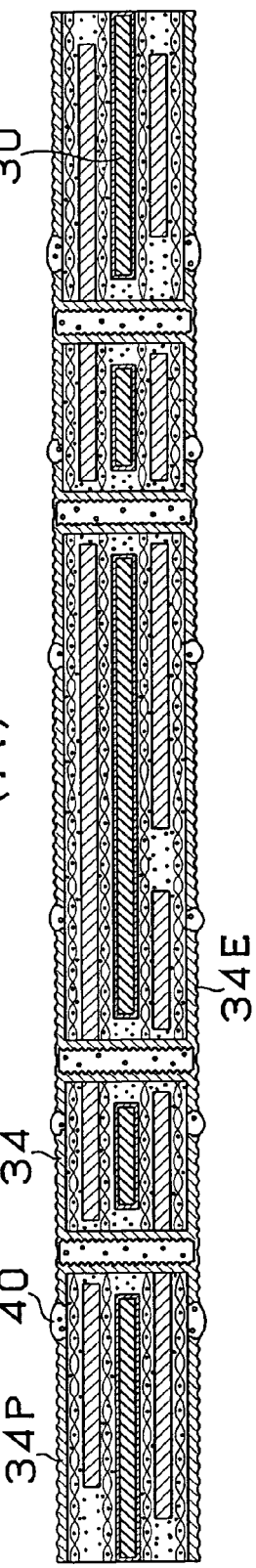
(B) 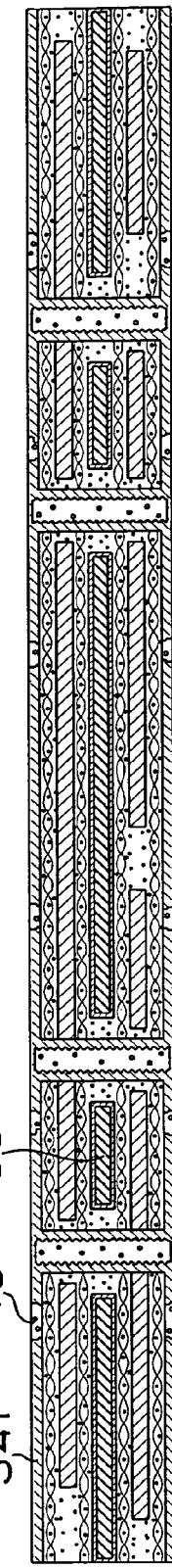
(C) 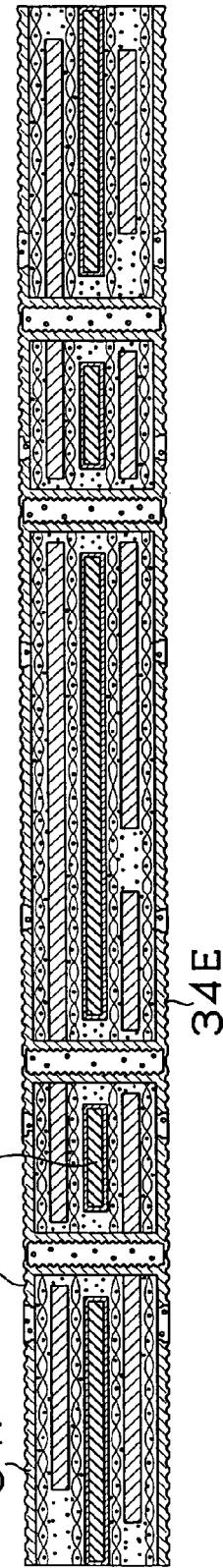

Fig. 16
(A)
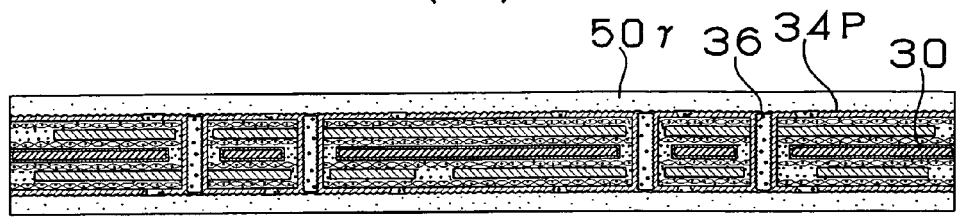
(B)
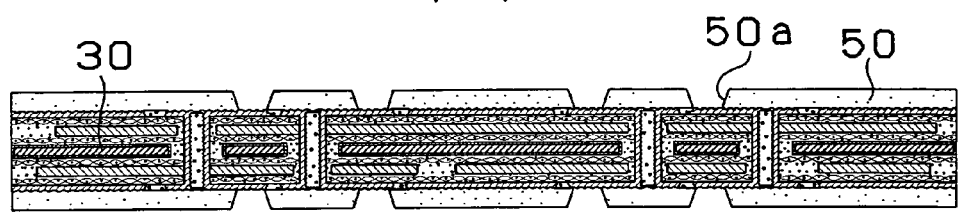
(C)
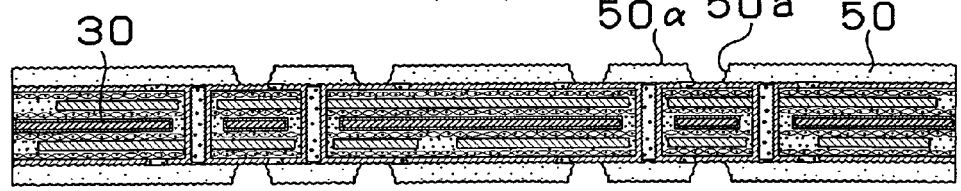
(D)
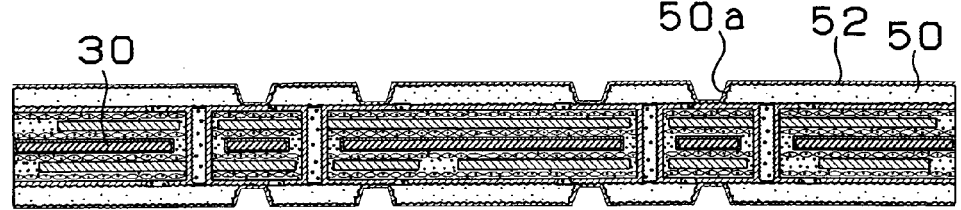

Fig.17
(A)
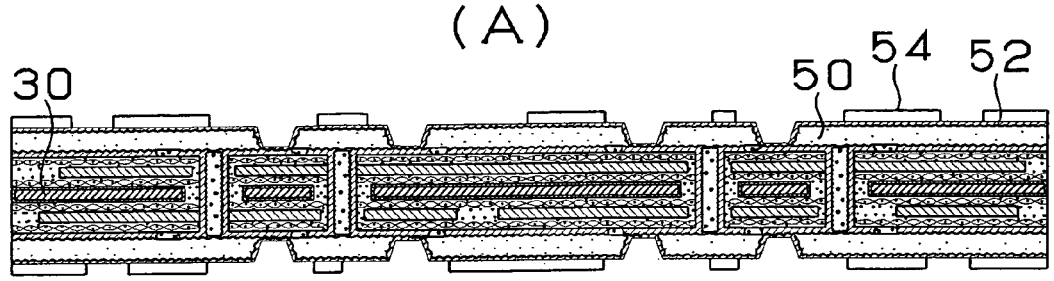
(B)
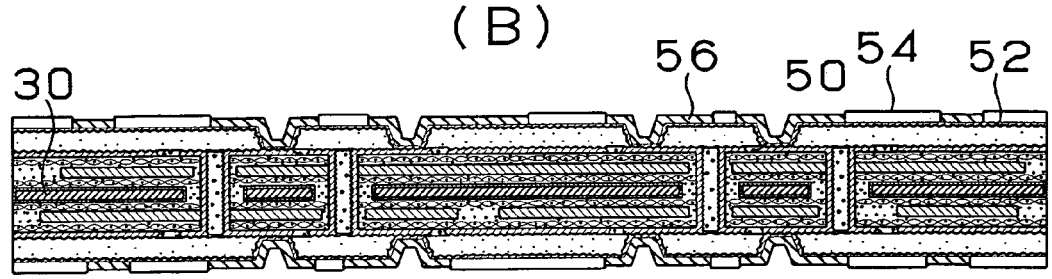
(C)
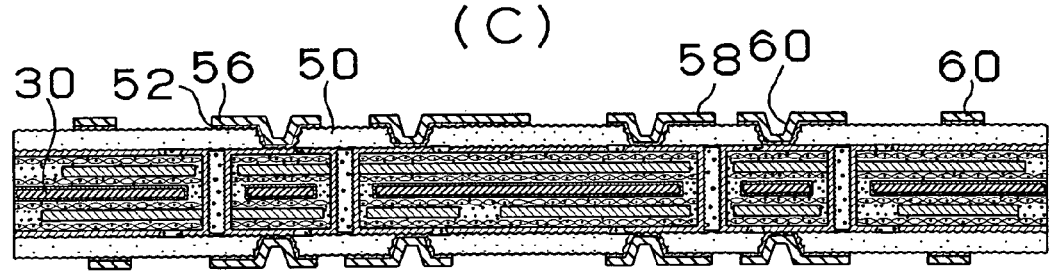
(D)
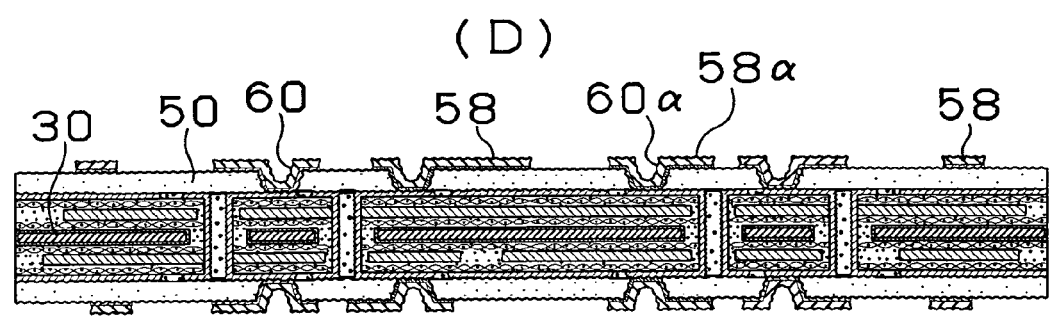

Fig.18
(A)
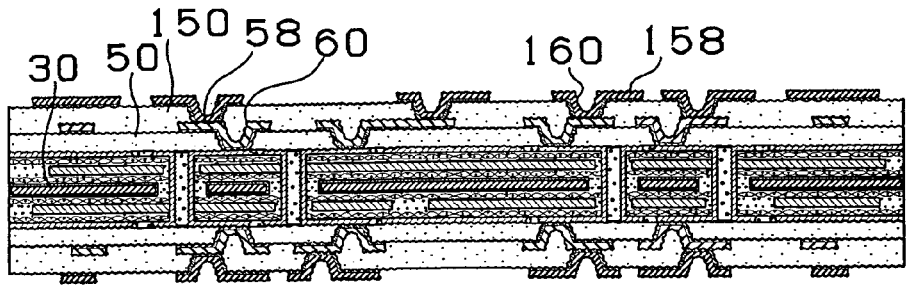
(B)
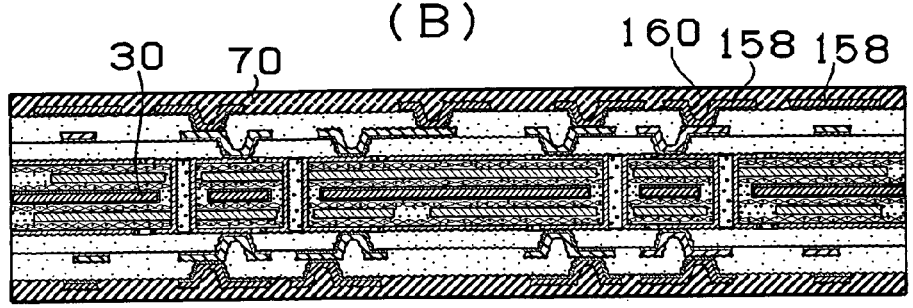
(C)
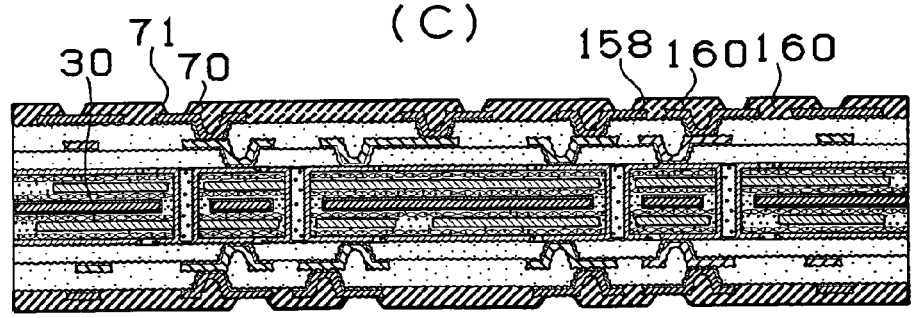
(D)
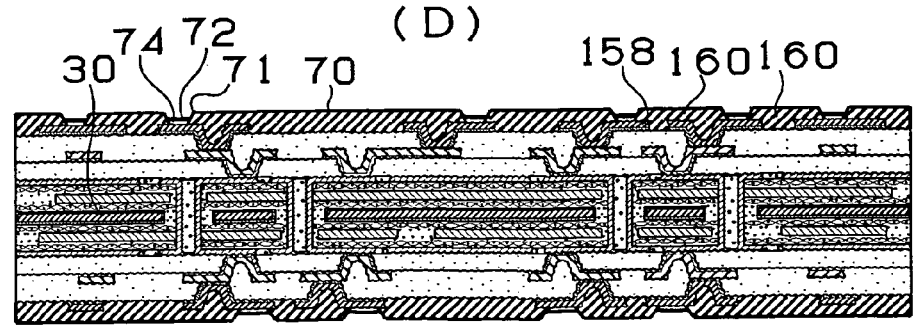

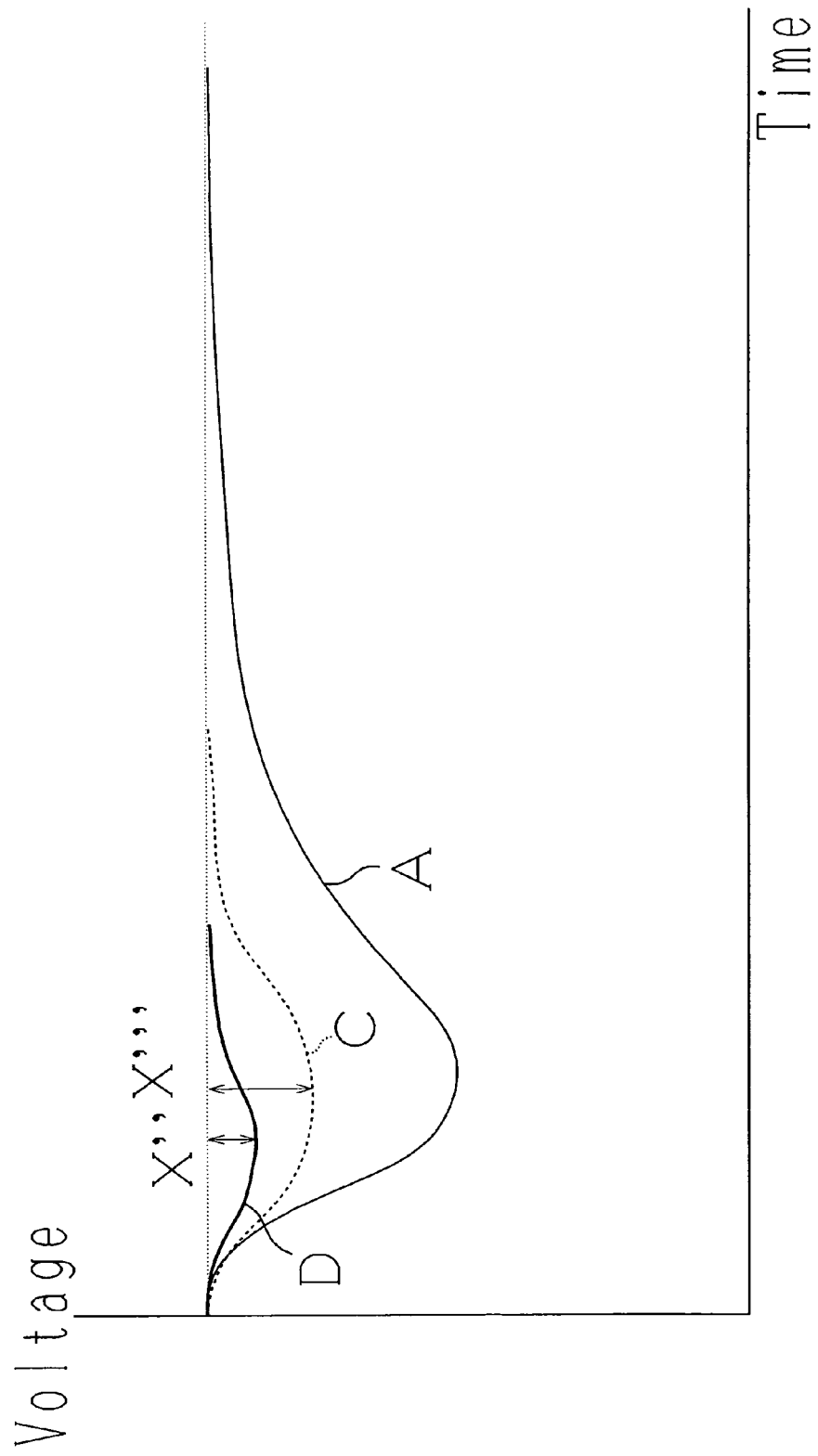

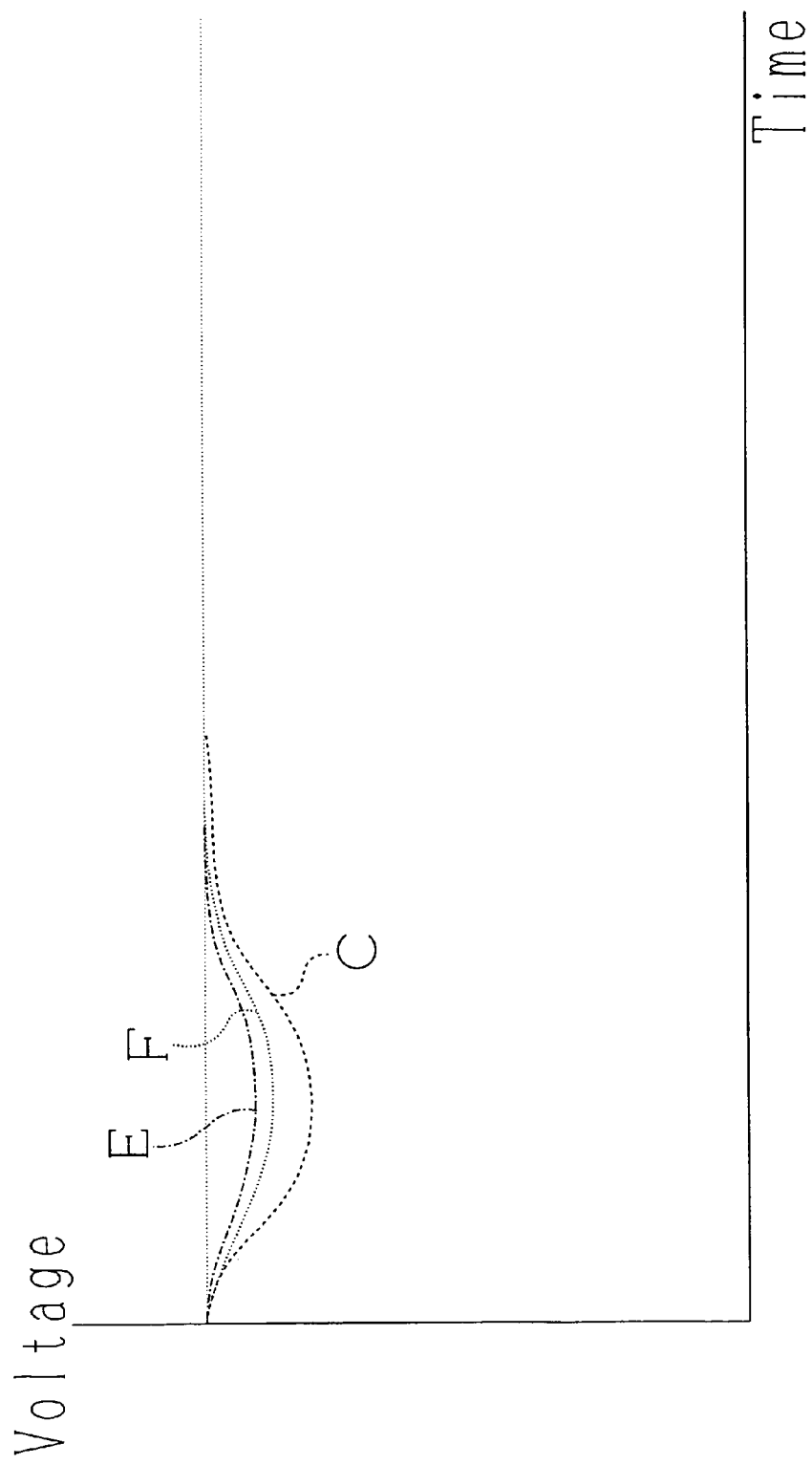

Fig. 27

| | Thickness of Conductor Circuit - Ratio α1/α2 | 100hr Presence/Absence of Malfunction of IC | 100hr Presence/Absence of Open | 300hr Presence/Absence of Malfunction of IC | 300hr Presence/Absence of Open | 500hr Presence/Absence of Malfunction of IC | 500hr Presence/Absence of Open | 1000hr Presence/Absence of Malfunction of IC | 1000hr Presence/Absence of Open | Voltage Drop Quantity Voltage (V) |
|---|---|---|---|---|---|---|---|---|---|---|
| Embodiment 1-1 | 2.0 | ○ | ○ | ○ | ○ | ○ | ○ | ○ | ○ | 0.087 |
| Embodiment 1-2 | 3.7 | ○ | ○ | ○ | ○ | ○ | ○ | ○ | ○ | 0.088 |
| Embodiment 1-3 | 5.0 | ○ | ○ | ○ | ○ | ○ | ○ | ○ | ○ | 0.088 |
| Embodiment 1-4 | 30.0 | ○ | ○ | ○ | ○ | ○ | ○ | ○ | ○ | 0.083 |
| Embodiment 1-5 | 1.2 | ○ | ○ | ○ | ○ | ○ | ○ | ○ | ○ | 0.089 |
| Embodiment 2-1 | 2.0 | ○ | ○ | ○ | ○ | ○ | ○ | ○ | ○ | 0.088 |
| Embodiment 2-2 | 3.7 | ○ | ○ | ○ | ○ | ○ | ○ | ○ | ○ | 0.088 |
| Embodiment 2-3 | 5.0 | ○ | ○ | ○ | ○ | ○ | ○ | ○ | ○ | 0.088 |
| Embodiment 2-4 | 30.0 | ○ | ○ | ○ | ○ | ○ | ○ | ○ | ○ | 0.084 |
| Embodiment 3-1 | 2.3 | ○ | ○ | ○ | ○ | ○ | ○ | ○ | ○ | 0.087 |
| Embodiment 3-2 | 3.7 | ○ | ○ | ○ | ○ | ○ | ○ | ○ | ○ | 0.087 |
| Embodiment 3-3 | 10.0 | ○ | ○ | ○ | ○ | ○ | ○ | ○ | ○ | 0.084 |
| Embodiment 3-4 | 30.0 | ○ | ○ | ○ | ○ | ○ | ○ | ○ | ○ | 0.083 |
| Embodiment 3-5 | 40.0 | ○ | ○ | ○ | ○ | ○ | ○ | ○ | ○ | 0.083 |
| Embodiment 4-1 | 3.3 | ○ | ○ | ○ | ○ | ○ | ○ | ○ | ○ | 0.088 |
| Embodiment 4-2 | 4.0 | ○ | ○ | ○ | ○ | ○ | ○ | ○ | ○ | 0.087 |
| Embodiment 4-3 | 5.0 | ○ | ○ | ○ | ○ | ○ | ○ | ○ | ○ | 0.088 |
| Embodiment 4-4 | 20.0 | ○ | ○ | ○ | ○ | ○ | ○ | ○ | ○ | 0.083 |
| Embodiment 4-5 | 30.0 | ○ | ○ | ○ | ○ | ○ | ○ | ○ | ○ | 0.083 |
| Embodiment 4-6 | 40.0 | ○ | ○ | ○ | ○ | ○ | ○ | ○ | ○ | 0.083 |

Fig. 28

| | Thickness of Conductor Circuit | 100hr | | 300hr | | 500hr | | 1000hr | | Voltage Drop Quantity |
|---|---|---|---|---|---|---|---|---|---|---|
| | Ratio α1/α2 | Presence/Absence of Malfunction of IC | Presence/Absence of Open | Presence/Absence of Malfunction of IC | Presence/Absence of Open | Presence/Absence of Malfunction of IC | Presence/Absence of Open | Presence/Absence of Malfunction of IC | Presence/Absence of Open | Voltage (V) |
| Embodiment 5-1 | 6.7 | ○ | ○ | ○ | ○ | ○ | ○ | ○ | ○ | 0.086 |
| Embodiment 5-2 | 5.4 | ○ | ○ | ○ | ○ | ○ | ○ | ○ | ○ | 0.086 |
| Embodiment 5-3 | 10.0 | ○ | ○ | ○ | ○ | ○ | ○ | ○ | ○ | 0.084 |
| Embodiment 5-4 | 20.0 | ○ | ○ | ○ | ○ | ○ | ○ | ○ | ○ | 0.083 |
| Embodiment 5-5 | 30.0 | ○ | ○ | ○ | ○ | ○ | ○ | ○ | ○ | 0.083 |
| Embodiment 5-6 | 40.0 | ○ | ○ | ○ | ○ | ○ | ○ | ○ | ○ | 0.082 |
| Embodiment 6-1 | 2.0 | ○ | ○ | ○ | ○ | ○ | ○ | ○ | ○ | 0.088 |
| Embodiment 6-2 | 3.7 | ○ | ○ | ○ | ○ | ○ | ○ | ○ | ○ | 0.087 |
| Embodiment 6-3 | 5.0 | ○ | ○ | ○ | ○ | ○ | ○ | ○ | ○ | 0.087 |
| Embodiment 6-4 | 30.0 | ○ | ○ | ○ | ○ | ○ | ○ | ○ | ○ | 0.083 |
| Comparison Example | 1.0 | × | ○ | × | ○ | × | × | × | × | 0.108 |
| Reference Example | 41.5 | ○ | ○ | ○ | ○ | ○ | ○ | ○ | × | 0.084 |

Presence/Absence of Malfunction of IC, (○ : No Malfunction; × : Malfunction, Presence/Absence of Open, ○: No Open, × : Open)

MULTILAYER PRINTED WIRING BOARD

TECHNICAL FIELD

This invention relates to a multilayer printed wiring board and provides a technique related to a multilayer printed wiring board capable of having improved electric characteristics and reliability without causing malfunction, error or the like even if a high frequency IC chip, particularly an IC chip in a high frequency range of 3 GHz or higher is mounted thereon.

BACKGROUND ART

In forming a buildup type multilayer printed wiring board constituting an IC chip package, interlayer insulating resin is formed on one of or each of the surfaces of a core substrate having through holes formed therein and via holes for interlayer conduction are opened by a laser or photo etching, whereby an interlayer resin insulating layer is thereby formed. A conductor layer is formed on the via holes by plating or the like and etching and the like are performed to form a pattern, thus creating a conductor circuit. Further, by repeatedly forming the interlayer insulating layer and the conductor layer, the buildup multilayer printed wiring board is obtained. By forming solder bumps and external terminals (PGA/BGA's or the like) on the front layer of the board at need, the board becomes a substrate capable of mounting an IC chip thereon or a package substrate. The IC chip is C4 (flip-chip) mounted, whereby the IC chip is electrically connected to the substrate.

As prior art of the buildup type multilayer printed wiring board, there are known JP1994-260756A and JP1994-275959A. In both of the publications, a land is formed on a core substrate having through holes filled with resin filler, interlayer insulating layers having via holes formed therein are provided on the both surfaces of the substrate, respectively, a conductor layer is formed by an additive method and the conductor layer is connected to the land, thereby obtaining a high density multilayer wiring board having fine wirings formed thereon.

However, as the frequency of an IC chip is higher, the frequency of occurrence of malfunction or error becomes higher. Particularly if the frequency of the IC chip exceeds 3 GHz, the frequency of occurrence of malfunction or error considerably increases. If the frequency exceeds 5 GHz, the IC chip often turns inoperative. Due to this, a computer including the IC chip as a CPU cannot perform operations that the computer should do, i.e., cannot perform desired functions and operations such as the recognition of an image, the changeover of a switch and the transmission of data to the outside of the computer.

If the substrate for an IC chip of this type is to be subjected to a non-destructive test and to be dissembled, no problems such as short-circuit or opens do not occur to the substrate itself and if the IC chip having a low frequency (particularly less than 1 GHz) is mounted on the substrate, then no malfunction or error occurs to the IC chip.

The present invention has been achieved to solve the above-stated disadvantages and the object of the present invention is to provide a multilayer printed wiring board capable of being constituted as a printed board or a package substrate free of malfunction or error even with an IC chip in a high frequency range, particularly, with a frequency exceeding 3 GHz.

DISCLOSURE OF THE INVENTION

The inventors of the present invention achieved the invention mainly constituted as shown in the following contents as a result of devoted studies to the realization of the above object.

According to the present invention, a multilayer printed wiring board having an interlayer insulating layer and a conductor layer formed on a core substrate, the conductor layer being electrically connected through a via hole, is characterized in that a thickness of the conductor layer on the core substrate is larger than a thickness of the conductor layer on the interlayer insulating layer.

The first advantage of the invention is that by making the conductor layer as the power supply layer of the core substrate thick, it is possible to intensify the strength of the core substrate and that even if the core substrate itself is made thin, it is possible for the substrate itself to relax warps and generated stresses.

The second advantage of the invention is that by making the conductor layers thick, it is possible to increase the volumes of the conductors themselves. By increasing the volumes, it is possible to decrease the resistances of the conductors. Due to this, the electrical transmission of the signal line or the like is not hampered. Accordingly, the loss of the signal transmitted or the like does not occur. This advantage is exhibited by making only the substrate which becomes the core thick.

The third advantage of the invention is that by employing the conductor layer as the power supply layer, it is possible to improve the capability of supplying power to the IC chip. In addition, by employing the conductor layer as the earth layer, it is possible to decrease the noise superposed on the signal and power to the IC chip. This is because the decreased resistances of the conductors as described as the second advantage can prevent the supply of power from being hampered. Due to this, if the IC chip is mounted on the multilayer printed wiring board, it is possible to decrease a loop inductance from the IC chip—the substrate—the power supply. Accordingly, power shortage in an initial operation is decreased to make it difficult to cause power shortage. Even if the IC chip in a higher frequency range is mounted on the multilayer printed wiring board, malfunction, error or the like does not occur in the initial operation.

Further, even if the power is supplied to the IC chip via the IC chip—the substrate—capacitors or the power supply layer—power, the same advantage can be exhibited. The loop inductance can be decreased. For this reason, no loss occurs to the supply of power to the capacitors or dielectric layers. In the first place, the IC chip performs complex arithmetic processings and operations while instantaneously consuming power. By supplying power from the power supply layer to the IC chip, it is possible to supply the power without the need to mount many capacitors even if the IC chip in a high frequency range is mounted and power shortage (a state of the occurrence of voltage drop) occurs in the initial operation. Power shortage (voltage drop) in the initial operation occurs so as to employ the IC chip in the high frequency range. If the conventional IC chip is used, the necessary power is sufficiently supplied by the capacity of the capacitors or dielectric layers.

Particularly if the thickness of the conductor layer serving as the power supply layer of the core substrate is larger than the thickness of the conductor layer on the interlayer insulating layer on each surface or both surfaces of the core substrate, the three advantages stated above can be maximized. The conductor layer on the interlayer insulating layer mainly means herein a conductor layer formed by forming via holes which are non-through holes for interlayer connection in an interlayer resin insulating layer made of resin the core material of which is not impregnated and conducting plating and sputtering. As long as the conductor layer has via holes formed therein, but not limited thereto, the conductor layer can be used as the conductor layer on the interlayer insulating layer.

The power supply layer of the core substrate may be arranged on the surface layer or inner layer of the substrate or on each of the surface layer and the inner layer. If the power supply layer is formed on the inner layer, a plurality of layers of two or more may be arranged. Basically, as long as the power supply layer of the core substrate is thicker than the conductor layer of the interlayer insulating layer, the advantage of the power supply layer can be exhibited.

It is, however, preferable to form the power supply layer on the inner layer. If it is formed on the inner layer, the power supply layer is arranged between the IC chip and the external terminals or capacitors. Due to this, the distances between the IC chip and the external terminals or capacitors are uniform, which decreases hampering factors and can suppress power shortage.

Further, according to the present invention, a multilayer printed wiring board having an interlayer insulating layer and a conductor layer formed on a core substrate, the conductor layer being electrically connected through a via hole, is characterized in that if a thickness of the conductor layer on said core substrate is $\alpha 1$ and a thickness of the conductor layer on the interlayer insulating layer is $\alpha 2$, $\alpha 1$ and $\alpha 2$ satisfy $\alpha 2 < \alpha 1 \leq 40\alpha 2$.

At $\alpha 1 \leq \alpha 2$, the advantage against the power shortage is not exhibited at all. That is, it is not clear that the voltage drop which occurs in the initial operation is suppressed.

A case in which a1 exceeds $40\alpha 2$ ($\alpha 1 > 40\alpha 2$) has been also considered. However, the electrical characteristics of a1 are basically equal to those of $40\alpha 2$. That is, it is understood that $40\alpha 2$ is a critical point of the advantage of the present application. Even if $\alpha 1$ is larger than $40\alpha$, the improvement of the electrical advantage cannot be expected. Nevertheless, if $\alpha 1$ exceeds $40\alpha$ and the conductor layer is formed on the surface layer of the core substrate, it is difficult to form lands or the like for the connection of the conductor layer to the core substrate. If the further upper interlayer insulating layer is formed, irregularities grow and waviness sometimes occurs to the interlayer insulating layers and impedances cannot be matched. However, that range ($\alpha 1 > 40\alpha 2$) does not often cause any problem depending on the materials.

It is more preferable that al satisfies $1.2\alpha 2 \leq \alpha 1 \leq 40\alpha 2$. It is confirmed that the malfunction, error or the like of the IC chip due to the power shortage (voltage drop) does not occur.

The core substrate means herein a resin substrate the core material of which, such as glass epoxy resin, is impregnated, a ceramic substrate, a metal substrate, a composite core substrate using a combination of resin, ceramic and metal, a substrate having a (power supply) conductor layer provided on the inner layer of the substrate, a multilayer core substrate having three or more conductor layers formed thereon, or the like.

To make the conductor of the power supply layer thick, the conductor layer may be formed on the substrate buried with metal by an ordinary method in relation to the printed wiring board for forming the conductor layer by plating, sputtering or the like.

If the substrate is the multilayer core substrate, the sum of the thickness of the conductor layer on the surface layer of the core substrate and that of the conductor layer on the inner layer of the core substrate is equal to the thickness of the conductor layers of the core. In this case, the multilayer wiring board is employed if the conductor layer on the surface layer is electrically connected to the conductor layer on the inner layer and the electrical connection thereof is established in two or more portions. That is, even if the number of layers increases, the thickness of the conductor layers of the core substrate is to be increased but the advantage remains the same. Further, if the area of a conductor layer is almost equal to that of a pad or a land, the thickness of the conductor layer is not considered to be added. It is preferable that the conductor layer is the power supply layer or the earth layer.

In this case, the core substrate may comprise three layers (surface layers+inner layer). A multilayer core substrate comprising three or more may be used.

If necessary, such components as capacitors, dielectric layers or resistances may be buried in the inner layer of the core substrate and an electric component containing core substrate thus formed may be used.

Further, if the conductor layer on the inner layer of the core substrate is made thick, it is preferable to arrange the conductor layers right under the IC chip. By arranging the conductor layers right under the IC chip, it is possible to minimize the distance between the IC chip and the power supply layer and to thereby further decrease the loop inductance. Accordingly, power is supplied more efficiently and the power shortage problem is solved. At this time, it is preferable that if the thickness of the conductor layer on the core substrate is al and the thickness of the conductor layer on the interlayer insulating layer is $\alpha 2$, $\alpha 1$ and $\alpha 2$ satisfy $\alpha 2 < \alpha 1 \leq 40\alpha 2$.

The core substrate according to the present invention is defined as follows. The core substrate is constituted so that the substrate is made of a hard base material such as resin the core material of which is impregnated, photo-via holes or laser via holes are formed therein using insulating resin layers each of which does not include a core material or the like, conductor layers are formed, and interlayer electrical connection is established. The thickness of the core substrate is relatively larger than that of each resin insulating layer. Basically, the conductor layer mainly used as a power supply layer is formed and other signal lines or the like are formed only for the connection between the front and rear surfaces of the substrate.

In case of a multilayer printed wiring board having a plurality of layers made of materials equal in thickness and built up, the layer having the power supply layer as the conductor layer on the printed board or the substrate is defined as the core substrate.

It is also preferable that the multilayer core substrate is such that a relatively thick conductor layer is provided on the inner layer, a relatively thin conductor layer is provided on the surface layer and that the conductor layer on the inner layer is a conductor layer mainly for a power supply layer or an earth. (Relatively thick and relatively thin mean herein that if the thicknesses of all the conductor layers are compared and there are a relatively thick layer and a relatively thin layer, then the inner layer is relatively thick to the other conductor layers and the surface layer is relatively thin.)

Namely, by arranging the thick conductor layer on the inner layer side, it is possible to form the resin layer to cover the conductor layer on the inner layer and ensure the flatness of the core even if the thickness of the thick conductor layer is arbitrarily changed. Due to this, waviness does not occur to the conductor layer of the interlayer insulating layer. Even if the thin conductor layer is arranged on the surface layer of the multilayer core substrate, it is possible to secure a sufficient thickness of the conductor layers as those of the core by adding together the thicknesses of the thin conductor layer and the conductor layer on the inner layer. By employing the conductor layers for power supply layers or earth layers, it is possible to improve the electrical characteristics of the multilayer printed wiring board.

The thickness of the conductor layer on the inner layer of the core substrate is made larger than the thickness of the conductor layer on the interlayer insulating layer. By doing so, even if the conductor layer is arranged on the surface of the multilayer core substrate, it is possible to secure the sufficient thickness of the conductor layers of the core by adding together the thicknesses of the conductor layer on the surface of the substrate and the thick conductor layer on the inner layer. Namely, even if a large capacity of power is supplied, the IC chip can be actuated without causing any problems, so that no malfunction or operational defect occurs to the IC chip. At this time, it is preferable that if the thickness of the conductor layer on the core substrate is $\alpha 1$ and the thickness of the conductor layer on the interlayer insulating layer is $\alpha 2$, $\alpha 1$ and $\alpha 2$ satisfy $\alpha 2 < \alpha 1 \leq 40\alpha 2$.

In case of a multilayer core substrate, it is preferable that the conductor layer on the inner layer is made relatively thick and used as a power supply layer, and that the conductor layers on the surface layer are formed to put the conductor layer on the inner layer therebetween and used as signal lines. With this structure, it is possible to intensify power as described above.

Furthermore, by arranging the signal line between the conductor layers in the core substrate, it is possible to form a micro-strip structure. Due to this, it is possible to decrease inductance and to match impedances to one another. It is thereby possible to stabilize the electric characteristics of the multilayer printed wiring board. It is further preferable that the conductor layer on the surface layer is relatively thin. The through hole pitch of the core substrate may be not more than 600 μm.

It is preferable that the multilayer core substrate is constituted so that the conductor layer on the inner layer is formed on the each surface of the metallic plate electrically connected to the conductor layer through a resin layer and that the conductor layer on the surface is formed outside of the inner layer conductor layer through a resin layer. By arranging the electrically insulated metallic plate in the central portion, it is possible to secure sufficient mechanical strength. Further, by forming the inner layer conductor layer on each surface of the metallic plate through the resin layer and forming the surface conductor layer outside of the inner layer conductor layer through the resin layer, it is possible to impart symmetry to the both surfaces of the metallic plate and to prevent the occurrence of warps, waviness and the like in a heat cycle and the like.

In FIG. 24, the vertical axis indicates voltage supplied to the IC chip and the horizontal axis indicates passage of time. In FIG. 24, printed wiring boards without capacitors for the power supply of IC chip with high frequency of 1 GHz or higher are used as models. A curve A shows the change of the voltage to an IC chip with 1 GHz with the passage of time, and a curve B shows the change of the voltage to an IC chip with 3 GHz with the passage of time. According to each voltage change with time, when the IC chip starts to be actuated, a large quantity of power is instantaneously required. If the supply of power is insufficient, voltage drops (at point X or X'). Thereafter, the power to be supplied is gradually added, so that the voltage drop is eliminated. However, if the voltage drops, malfunction or error tends to occur to the IC chip. That is, a defect caused by the insufficient function or actuation of the IC chip due to lack of the supply of power occurs. This power shortage (voltage drop) grows as the frequency of the IC chip is higher. Due to this, it takes time to solve the voltage drop problem and a time lag occurs in allowing the IC to perform a desired function or actuating the IC.

To compensate for the power shortage (voltage drop), the IC chip is connected to an external capacitor and the power accumulated in the capacitor is discharged, whereby the power shortage or voltage drop problem can be solved.

In FIG. 25, printed boards with capacitors are used as models. A curve C shows the change of the voltage to the IC chip with 1 GHz with the passage of time if a small capacity of a capacitor is mounted on the board. Compared with the curve A which shows a case where the capacitor is not mounted, the degree of the voltage drop of the curve C is low. Further, a curve D shows the change of the voltage to the IC with the passage of time similarly to the curve C if a capacitor larger in capacity than the capacitor mounted in case of the curve C. Compared with the curve C, the degree of the voltage drop of the curve D is lower. Thus, in case of the curve D, it is possible to function and actuate a desired chip in short time. However, as shown in FIG. 24, if the frequency of the IC chip is higher, a larger capacity of the capacitor is required. As a result, the region on which the capacitor is mounted needs to be established. Therefore it is difficult to secure the voltage, it is impossible to improve the operation and function of the IC chip and it is difficult to improve the density of the IC chip.

FIG. 26 is a graph if the thickness of the conductor layer of the core substrate and that of the conductor layer as the power supply is $\alpha 1$ and that of the conductor layer on the interlayer insulating layer is $\alpha 2$. In FIG. 26, a curve C shows the change of the voltage with the passage of time if a small capacity of a capacitor is mounted on an IC chip with 1 GHz and $\alpha 1 = \alpha 2$. A curve F shows the change of the voltage with the passage of time if a small capacity of a capacitor is mounted on the IC chip with 1 GHz and $\alpha 1 = 1.5\alpha 2$. A curve E shows the change of the voltage with the passage of time if a small capacity of a capacitor is mounted on the IC chip with 1 GHz and $\alpha 1 = 2.0\alpha 2$. As the conductor layer of the core is thicker, the power shortage or voltage drop becomes lower. Due to this, it may be said that the malfunction of the IC chip less occurs. By making the conductor layer of the core substrate and the conductor layer as the power supply layer thick, the volumes of the conductor layers increase. If the volumes increase, the conductor resistances decrease, so that the loss of the power to be transmitted to the voltage or current is eliminated. As a result, power is supplied while the transmission loss between the IC chip and the power supply is lowered, no malfunction or error occurs to the IC chip. This is mainly thanks to the thickness of the conductor layer as the power supply layer; by making the conductor layer as the power supply layer of the core substrate thicker than that on the other interlayer insulating layer, the advantage can be exhibited.

Furthermore, it is discovered that the advantage attained if the conductor formed on the surface layer on one surface or each surface of the core substrate and the conductor layer as the power supply layer are made thick can be also exhibited if the multilayer core substrate which comprises three or more layers is used and in which the conductor layer is formed on the inner layer or the conductor layer as the power supply layer is formed on the inner layer. Namely, the advantage of decreasing power shortage or voltage drop can be exhibited.

If the multilayer core substrate is employed, this advantage is exhibited when the sum of the thicknesses of all the conductor layers is larger than the thicknesses of the conductor layers on the interlayer insulating layers even if the thicknesses of the all the conductor layers and conductor layers for the power supply layers are smaller than the thicknesses of the conductor layers on the interlayer insulating layers or even if the thicknesses of the all the conductor layers and conductor layers for the power supply layers are equal to or smaller than the thicknesses of the conductor layers on the interlayer insulating layers. In this case, there is no difference in area among the conductor layers. In other words, this advantage is exhibited when all the conductor layers are equal in area. For example, if two conductor layers are provided, the one is a solid layer having a large area and the other has an area as small as a via hole or the land thereof, then the advantage of the one conductor layer is canceled by the other conductor layer.

Furthermore, even if the core substrate includes electronic components such as capacitors, dielectric layers or resistances, this advantage is conspicuously exhibited. By including the electronic components in the substrate, it is possible to shorten the distance between the IC chip and each capacitor or dielectric layer. It is, therefore, possible to decrease the loop inductance. It is possible to decrease the power shortage or voltage drop. In case of the core substrate including therein capacitors or dielectric layers, for example, by making the thicknesses of the conductor layers of the core substrate and the conductor layers as the power supply layer larger than the conductor layers on the interlayer insulating layers, it is possible to decrease the resistances of the conductors of both the main power supply and the power of the included capacitors or dielectric layer, thereby making it possible to decrease transmission loss and to further exhibit the advantage of the substrate including therein capacitors.

As the core substrate, the resin substrate is employed. However, it is discovered that the ceramic or metal core substrate exhibits the same advantage. As the material of the conductor layer, copper is employed. Even if the other metals are employed, it is not confirmed that the advantage is cancelled and malfunction or error occurs to the IC chip. It, therefore, appears that the advantage is not influenced by the difference in the material of the core substrate or the difference in the material of the conductor layers. It is more preferable that the conductor layers of the core substrate and those of the interlayer insulating layer are made of the same metal. This is because the advantages of the present application can be exhibited since there is no difference in such characteristics as electrical characteristics and the coefficient of thermal expansion and physical properties between the conductor layers of the core substrate and those of the interlayer insulating layers.

BRIEF DESCRIPTION OF THE DRAWINGS

FIG. 2 is a step diagram showing the method for manufacturing the multilayer printed wiring board according to Embodiment 1.

FIG. 3 is a step diagram showing the method for manufacturing the multilayer printed wiring board according to Embodiment 1.

FIG. 4 is a step diagram showing the method for manufacturing the multilayer printed wiring board according to Embodiment 1.

FIG. 5 is a step diagram showing the method for manufacturing the multilayer printed wiring board according to Embodiment 1.

FIG. 11 is a cross-sectional view showing a state in which an IC chip is mounted on the multilayer printed wiring board according to Embodiment 4.

FIG. 12 is a step diagram showing method for manufacturing a multilayer printed wiring board according to Embodiment 5 of the present invention.

FIG. 13 is a step diagram showing the method for manufacturing the multilayer printed wiring board according to Embodiment 5.

FIG. 14 is a step diagram showing the method for manufacturing the multilayer printed wiring board according to Embodiment 5.

FIG. 15 is a step diagram showing the method for manufacturing the multilayer printed wiring board according to Embodiment 5.

FIG. 16 is a step diagram showing the method for manufacturing the multilayer printed wiring board according to Embodiment 5.

FIG. 17 is a step diagram showing the method for manufacturing the multilayer printed wiring board according to Embodiment 5.

FIG. 18 is a step diagram showing the method for manufacturing the multilayer printed wiring board according to Embodiment 5.

FIG. 25 is a graph showing voltage change during the operation of the IC chip.

FIG. 26 is a graph showing voltage change during the operation of the IC chip.

FIG. 27 is a table showing the test results of Embodiments and a comparison example.

FIG. 28 is a table showing the test results of Embodiments and a comparison example.

BEST MODES FOR CARRYING OUT THE INVENTION

Embodiment 1

Glass Epoxy Resin Substrate

Figure 1:
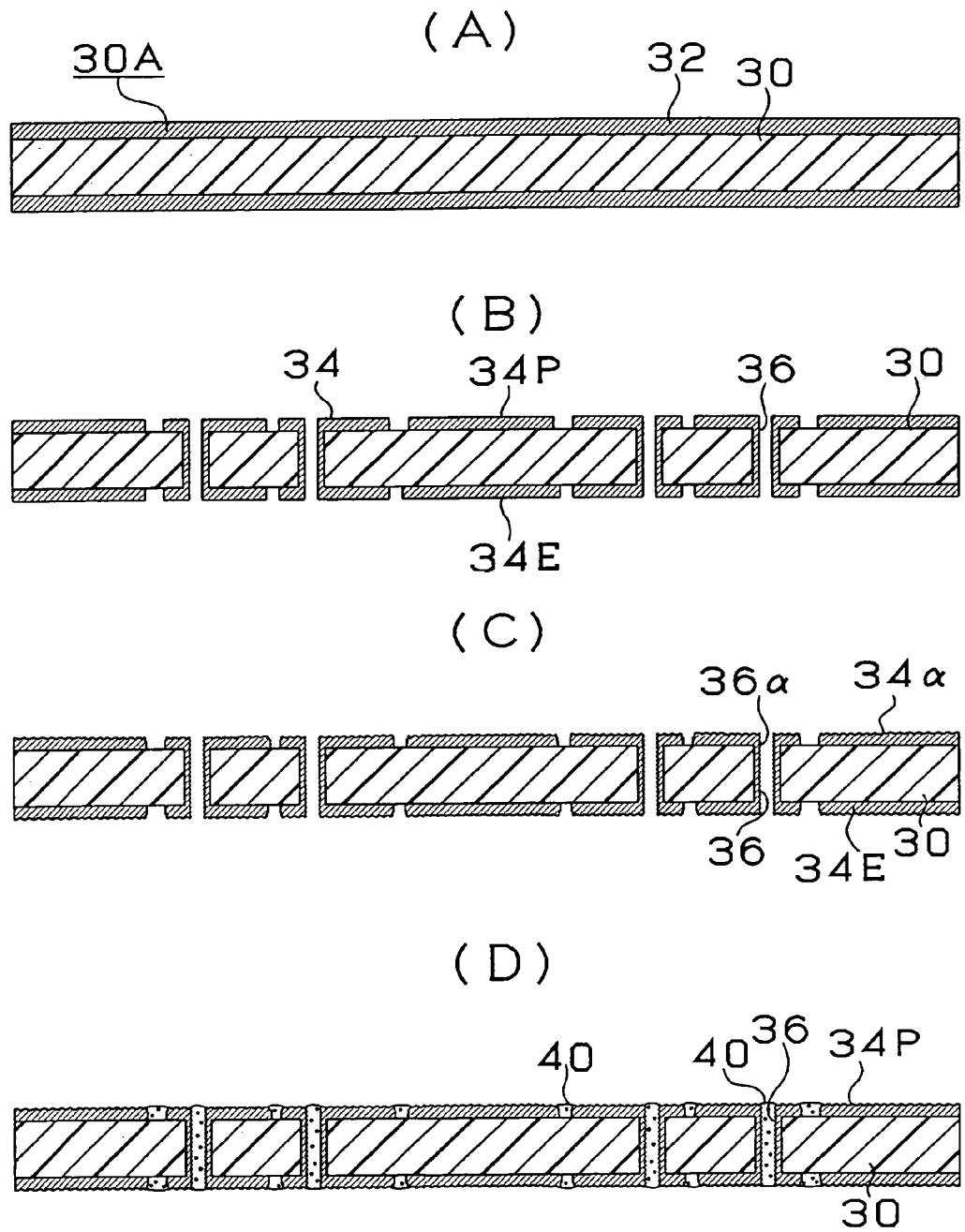
FIG. 1 is a step diagram showing a method for manufacturing a multilayer printed wiring board according to Embodiment 1 of the present invention.
Figure 6:
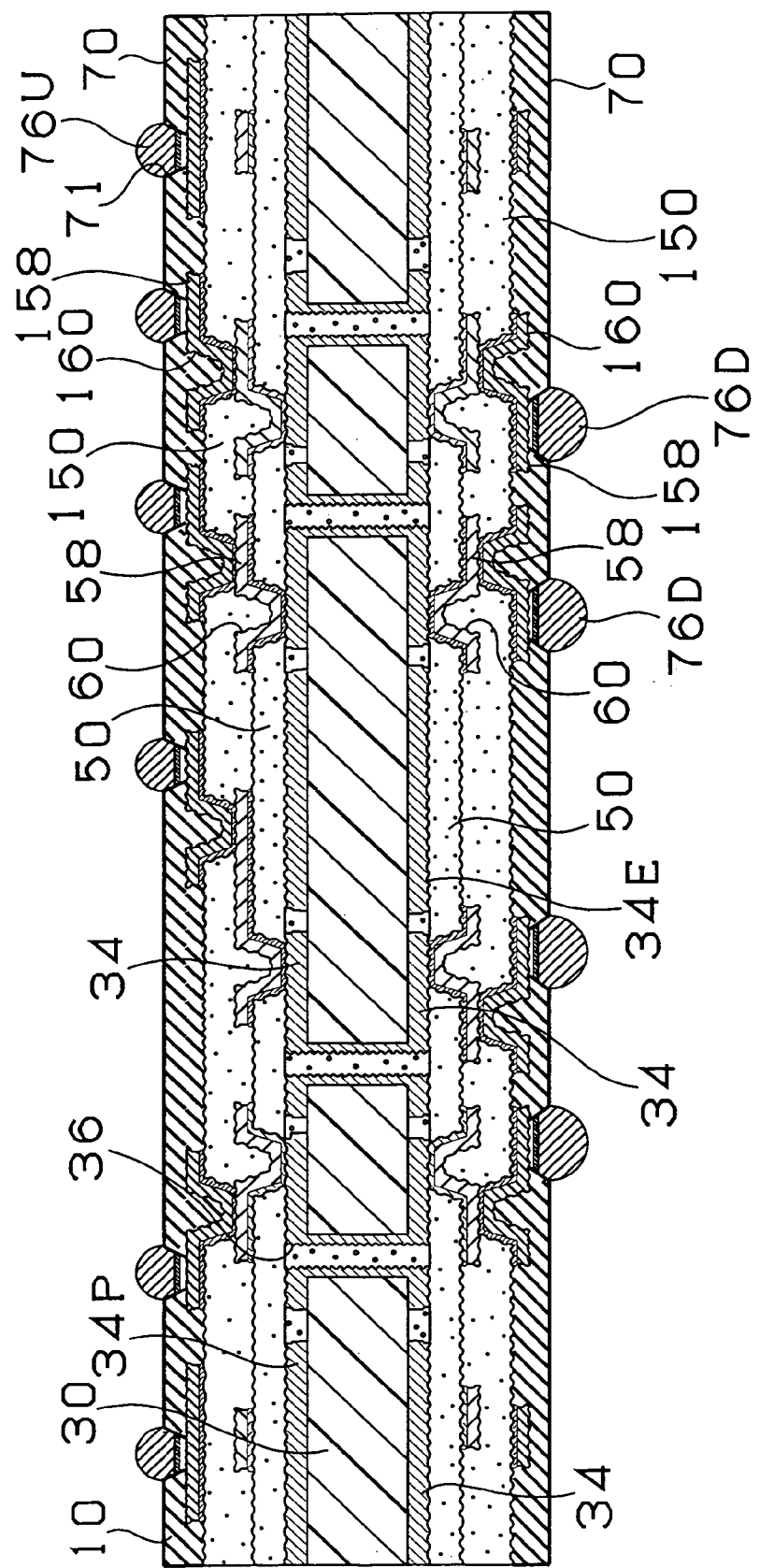
FIG. 6 is a cross-sectional view of the multilayer printed wiring board according to Embodiment 1.
Figure 7:
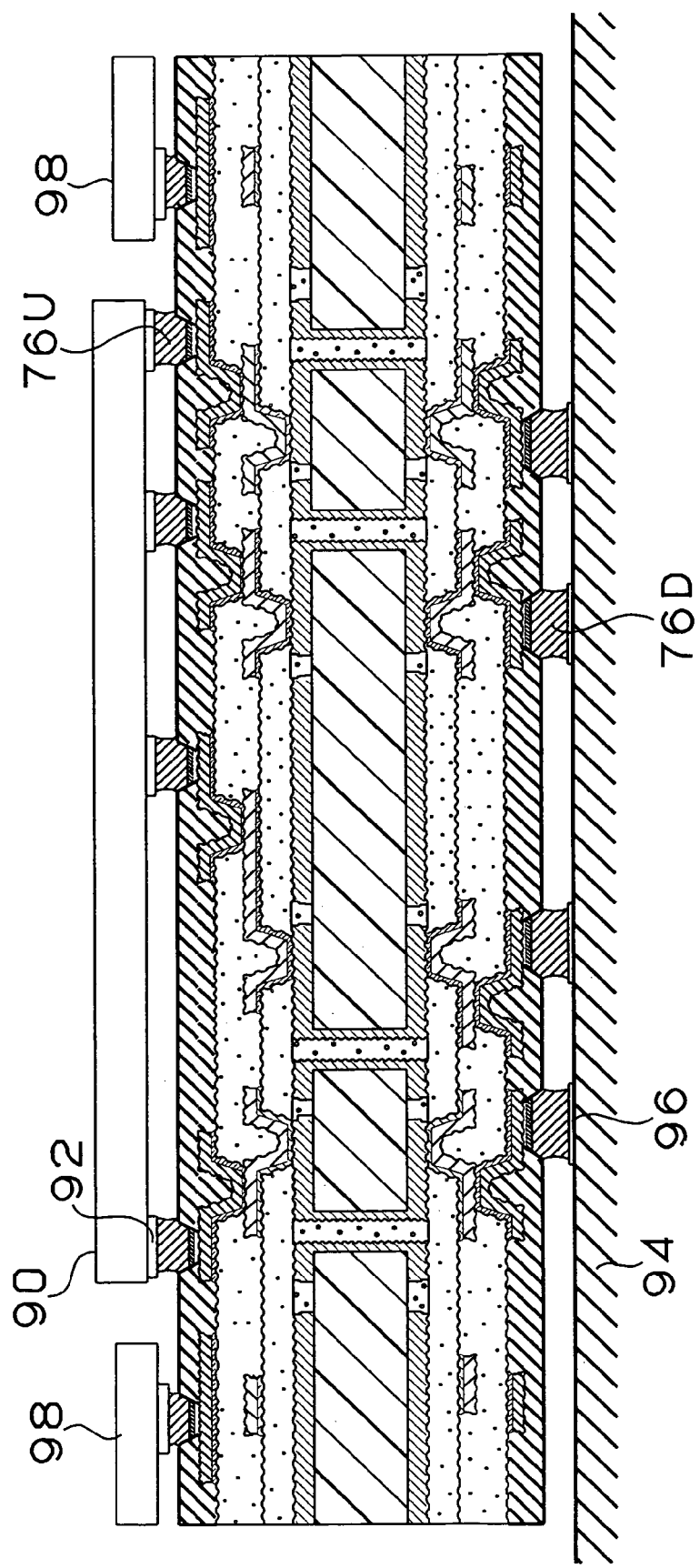
FIG. 7 is a cross-sectional view showing a state in which an IC chip is mounted on the multilayer printed wiring board according to Embodiment 1.

The configuration of a multilayer printed wiring board 10 according to Embodiment 1 of the present invention will first be described with reference to FIGS. 1 to 7. FIG. 6 shows the cross section of the multilayer printed wiring board 10 and FIG. 7 shows a state in which an IC chip 90 is attached to the multilayer printed wiring board 10 shown in FIG. 6 and in which the board 10 is mounted on a daughter board 94. As shown in FIG. 6, the multilayer printed wiring board 10 has a conductor circuit 34 and a conductor layer 34P formed on the front surface of a core substrate 30, and a conductor circuit 34 and a conductor layer 34E formed on the rear surface of the core substrate 30. The upper conductor layer 34P is formed as a power supply plane layer while the lower conductor layer 34E is formed as an earth plane layer. The front and rear surfaces of the core substrate 30 are connected to each other via through holes 36. In addition, an interlayer resin insulating layer 50 on which via holes 60 and conductor circuits 58 are formed and an interlayer resin insulating layer 150 on which via holes 160 and conductor circuits 158 are formed are provided on each of the conductor layers 34P and 34E. Solder resist layers 70 are formed on upper layers of the via holes 160 and the conductor circuits 158, and bumps 76U and 76D are formed on the via holes 160 and the conductor circuits 158 through the opening portions 71 of the solder resist layers 70, respectively.

As shown in FIG. 7, solder bumps 76U on the upper surface of the multilayer printed wiring board 10 are connected to lands 92 of the IC chip 90. Further, chip capacitors 98 are mounted on the board 10. Solder bumps 76D on the lower surface thereof are connected to lands 96 of the daughter board 94.

The conductor, layers 34P and 34E on the core substrate 30 are each formed to have a thickness of 1 to 250 μm, and the conductor circuits 58 on the interlayer resin insulating layers 50 and the conductor circuits 158 on the interlayer resin insulating layers 150 are each formed to have a thickness of 5 to 25 μm (preferably 10 to 20 μm).

On the multilayer printed wiring board according to Embodiment 1, the power supply layer (conductor layer) 34P and the conductor layer 34E of the core substrate 30 are made thick, thereby intensifying the strength of the core substrate, for which reason it is possible for the core substrate itself to relax warps and generated stresses even if the core substrate is made thin.

Furthermore, it is possible to increase the volumes of the conductors themselves by making the conductor layers 34P and 34E thick and to decrease the resistances of the conductors by increasing the volumes thereof.

In addition, by employing the conductor layer 34P as a power supply layer, it is possible to improve the capability of supplying power to the IC chip 90. Due to this, when the IC chip is mounted on the multilayer printed wiring board, it is possible to decrease a loop inductance of the IC chip—the substrate—the power supply. Accordingly, power shortage in an initial operation is decreased to make it difficult to cause power shortage. Therefore, even if the IC chip in a higher frequency range is mounted on the multilayer printed wiring board, malfunction, error or the like does not occur in the initial operation. Besides, by employing the conductor layer 34E as an earth layer, noise does not superpose on the signal of the IC chip and the supply of power to the IC chip, thus making it possible to prevent malfunction or error.

A method for manufacturing the multilayer printed wiring board 10 described above with reference to FIG. 6 will next be described with reference to FIGS. 1 to 5.

Embodiment 1-1

A. Manufacturing of Resin Film of Interlayer Resin Insulating Layer 29 parts by weight of bisphenol A type epoxy resin (epoxy equivalent weight of 455, Epicoat 1001 manufactured by Yuka Shell Epoxy), 39 parts by weight of cresol novolac type epoxy resin (epoxy equivalent weight of 215, EpiclonN-673 manufactured by Dainippon Ink and Chemicals) and 30 parts by weight of phenol novolac resin including a triazine structure (phenol hydroxyl group equivalent weight of 120, PhenoliteKA-7052 manufactured by Dainippon Ink and Chemicals) are heated and molten while being agitated with 20 parts by weight of ethyl diglycol acetate and 20 parts by weight of solvent naphtha, and 15 parts by weight of terminally epoxidized polybutadiene rubber (DenalexR-45EPT manufactured by Nagase Chemicals Ltd.) and 1.5 parts by weight of crushed product of 2-phenyl-4,5-bis(hydroxymethyl)imidazole, 2.5 parts by weight of pulverized silica and 0.5 parts by weight of silicon-based defoaming agent are added thereto, thereby preparing an epoxy resin composition.

The obtained epoxy resin composition is coated on a PET film having a thickness of 38 μm so as to have a thickness of 50 μm after being dried by a roll coater and dried for 10 minutes at 80 to 120° C., thereby manufacturing a resin film for an interlayer resin insulating layer.

B. Preparation of Resin Filler 100 parts by weight of bisphenol F type epoxy monomer (manufactured by Yuka Shell, molecular weight: 310, YL983U), 170 parts by weight of $SiO_2$ spheroidal particles having a silane coupling agent coated on surfaces thereof, a mean particle size of 1.6 μm, and a largest particle size of not more than 15 μm (manufactured by ADTEC Corporation, CRS 1101-CE) and 1.5 parts by weight of leveling agent (manufactured by Sannopuko KK, PelenolS4) are input in a container and agitated and mixed therein, thereby preparing resin filler having a viscosity of 44 to 49 Pa·s at 23±1° C. As hardening agent, 6.5 parts by weight of imidazole hardening agent (manufactured by Shikoku Chemicals, 2E4MZ-CN) is used. As the resin filler, thermosetting resin such as the other epoxy resin (e.g., bisphenol A type, novolac type or the like), polyimide resin or phenol resin may be used.

C. Manufacturing of Multilayer Printed Wiring Board (1) A copper-clad laminate 30A having copper foils 32 of 5 to 250 μm laminated on the both surfaces of an insulative substrate 30 made of glass epoxy resin having a thickness of 0.2~0.8 mm or BT (Bismaleimide-Triazine) resin, respectively, is used as a starting material (FIG. 1(A)). First, this copper-clad laminate 30A is drilled, subjected to an electroless plating treatment and an electroplating treatment, and etched into a pattern to thereby form conductor circuits 34, conductor layers 34P and 34E and through holes 36 on the both surfaces of the substrate, respectively (FIG. 1(B)).

(2) After washing and drying the substrate 30 having the through holes 36 and the lower layer conductor circuits 34 formed thereon, an oxidization treatment using an aqueous solution containing NaOH (10 g/l), NaClO2 (40 g/l) and Na3PO4 (6 g/l) as a blackening bath (an oxidation bath) and a reduction treatment using an aqueous solution containing NaOH (10 g/l) and NaBH4 (6 g/l) as a reduction bath are conducted to the substrate 30, thereby respectively forming roughened surfaces 36a in the through holes 36 and roughened surfaces 34α on the entire surfaces of the conductor circuits 34 and the conductor layers 34P and 34E (FIG. 1(C)).

(3) After preparing the resin filler described in B above, within 24 hours of preparation, according to the following method, layers of the resin filler 40 are formed in the through holes 36 and on the conductor circuit unformed portions of the substrate, respectively (FIG. 1(D)).

Namely, a resin filling mask having openings in portions corresponding to the through holes and the conductor circuit unformed portions is put on the substrate, and the resin filler 40 is filled into the through holes, depressed lower layer conductor circuit unformed portions and the outer edges of the lower layer conductor circuits with a squeegee and then dried at 100° C. for 20 minutes.

(4) One of the surfaces of the substrate which has been subjected to the treatment of (3) is polished by belt sander polishing using #600 belt abrasive paper (manufactured by Sankyo Rikagaku Co.) so as not to leave the resin filler 40 on the outer edges of the conductor layers 34P and 34E and those of the lands of the through holes 36, and the entire surfaces of the conductor layers 34P and 34E (including the land surfaces of the through holes) are then buffed to remove scratches caused by the belt sander polishing. A series of these polishing treatments are similarly conducted to the other surface of the substrate. The resin filler 40 is then heated at 100° C. for 1 hour and at 150° C. for 1 hour and hardened (FIG. 2(A)).

As a result, a substrate in which the surface layer portions of the resin fillers 40 formed in the through holes 36 and on the conductor circuit unformed portions and the surfaces of the conductor layers 34P and 34E are flattened, the resin fillers 40 are fixedly attached to the side surfaces of the conductor layers 34P and 34E through the roughened surfaces and the inner wall surfaces of the through holes 36 are fixedly attached to the resin fillers through the roughened surfaces, is obtained. That is to say, through the steps, the surfaces of the resin fillers become almost flush with those of the lower layer conductor circuits.

The conductor layers of the core substrate are formed to have a thickness of 1 to 250 µm and the conductor layer serving as the power supply layer and formed on the core substrate is formed to have a thickness of 1 to 250 µm. Here in Embodiment 1-1, the conductor layers of the core substrate are formed to have a thickness of 30 µm and the conductor layer serving as the power supply layers and formed on the core substrate is formed to have a thickness of 30 µm using the copper foils of 40 µm. However, the thicknesses of the conductor layers may exceed the above thickness range.

(5) After washing and acid-degreasing the substrate, soft etching is conducted to the substrate and etchant is sprayed onto the both surfaces thereof to etch the surfaces of the conductor circuits 34, the conductor layers 34P and 34E and the land surfaces of the through holes 36, thereby forming roughened surfaces 36β, on the entire surfaces of the respective conductor circuits (see FIG. 2(B)). As the etchant, etchant (manufactured by Mech Corporation, Mech-Etch Bond) comprising 10 parts by weight of an imidazole copper (II) complex, 7.3 parts by weight of glycolic acid and 5 parts by weight of potassium chloride is used.

(6) Interlayer resin insulating layer resin films 50γ slightly larger than the substrate manufactured in A are put on the both surfaces of the substrate, respectively, temporarily press-fitted under conditions of pressure of 0.45 MPa, a temperature of 80° C. and press-fit time of 10 seconds and cut, and then bonded using a vacuum laminator by the following method, thereby forming interlayer resin insulating layers (FIG. 2(C)). Namely, the interlayer resin insulating layer resin films are actually press-fitted onto the substrate under conditions of vacuum of 67 Pa, pressure of 0.47 MPa, a temperature of 85° C. and press-fit time of 60 seconds, and then thermally hardened at 170° C. for 40 minutes.

(7) Next, through a mask having pass-through holes having a thickness of 1.2 mm formed therein, openings 50a for via holes are formed to have a diameter between 60 to 100 µm in the interlayer resin insulating layers 2 by a CO2 gas laser at a wavelength of 10.4 µm under conditions of a beam diameter of 4.0 mm, a top hat mode, a pulse width of 8.1 microseconds, the pass-through hole diameter of the mask of 1.0 mm and one shot (FIG. 2(D)). In this case, the openings 50a are formed to have diameters 60 µm and 75 µm.

(8) The substrate having the via hole openings 6 formed therein is immersed in a solution containing 60 g/l of permanganic acid at a temperature of 80° C. for 10 minutes to melt and remove epoxy resin particles existing on the surfaces of the interlayer resin insulating layers 2, thereby forming roughened surfaces 50a on the surfaces of the respective interlayer resin insulating layers 50 including the inner walls of the via hole openings 50a (FIG. 2(E)).

(9) Next, the substrate which has been subjected to the above-stated treatments is immersed in neutralizer (manufactured by Shipley Corporation) and then washed.

Further, a palladium catalyst is added to the surfaces of the roughened substrate (a roughening depth of 3 µm), thereby attaching catalyst nuclei to the surfaces of the interlayer resin insulating layers and the inner wall surfaces of the via hole openings. Namely, the substrate is immersed in a catalytic solution containing palladium chloride (PbCl2) and stannous chloride (SnCl2) and palladium metal is precipitated, thereby attaching the catalyst.

(10) The substrate to which the catalyst is attached is immersed in an electroless copper plating aqueous solution having the following composition and electroless copper plated films having a thickness of 0.3 to 3.0 µm are formed on the entire roughened surfaces, thereby obtaining the substrate having electroless copper plated films 52 formed on the surfaces of the interlayer resin insulating layers 50 including the inner walls of the via hole openings 50a (FIG. 3(A)).

| [Electroless plating aqueous solution] | |
| --- | --- |
| NiSO4 | 0.003 mol/l |
| Tartaric acid | 0.200 mol/l |
| Copper sulfate | 0.032 mol/l |
| HCHO | 0.050 mol/l |
| NaOH | 0.100 mol/l |
| α, α'-bipyridyl | 100 mg/l |
| Polyethylene glycol (PEG) | 0.10 g/l |

[Electroless Plating Conditions]
45 minutes and a solution temperature of 34° C.

(11) Commercially available sensitive dry films are bonded to the substrate on which the electroless copper plated films 52 are formed, a mask is put on the substrate, the substrate is exposed at 110 mJ/cm² and developed with a 0.8% sodium carbonate aqueous solution, thereby providing plating resists 54 having a thickness of 25 µm (FIG. 3(B)).

(12) Next, the substrate is cleaned and degreased with water at 50° C., washed with water at 25° C., cleaned with sulfuric acid and electroplated under the following conditions, thereby forming electroplated copper films 56 having a thickness of 20 μm on portions on which the plating resists 54 are not formed (FIG. 3(C)).

| [Electroplating solution] | |
| --- | --- |
| Sulfuric acid | 2.24 mol/l |
| Copper sulfate | 0.26 mol/l |
| Additive (Kalapacid GL manufactured by Atotech Japan) | 19.5 ml/l |

| [Electroplating conditions] | |
| --- | --- |
| Current density | 1 A/dm$^2$ |
| Time | 65 minutes |
| Temperature | 22 ± 2° C. |

(13) After peeling off the plating resists 3 with 5% KOH, the electroless plated films under the plating resist are etched, molten and removed with a solution mixture of sulfuric acid and hydrogen peroxide, thus forming independent conductor circuits 58 and via holes 60 (FIG. 3(D)).

(14) The same treatment as that of (5) is performed to form roughened surfaces 58α and 60α on the surfaces of the conductor circuits 58 and the via holes 60. The thickness of the upper layer conductor circuits 58 is 15 μm (FIG. 4(A)). However, the upper layer conductor circuits may be formed to have a thickness between 5 and 25 μm.

(15) The steps (6) to (14) stated above are repeated, thereby forming further upper layer conductor circuits and a multilayer wiring board is obtained (FIG. 4(B)).

(16) Next, 45.67 parts by weight of oligomer (molecular weight: 4000) which is obtained by forming 50% of epoxy groups of 60 parts by weight of cresol novolac type epoxy resin (manufactured by Nippon Kayaku Co., Ltd.) dissolved in diethylene glycol dimethyl ether (DMDG) into an acrylic structure and which imparts photosensitive characteristic, 16.0 parts by weight of 80 wt % of bisphenol A type epoxy resin (manufactured by Yuka Shell, product name: Epicoat 1001) dissolved in methylethyl ketone, 1.6 parts by weight of imidazole hardening agent (manufactured by Shikoku Chemicals, product name: 2E4MZ-CN), 4.5 parts by weight of bifunctional acryl monomer which is photosensitive monomer (manufactured by Kyoei Chemical, product name: R604); 1.5 parts by weight of polyhydric acryl monomer (manufactured by Kyoei Chemical, product name: DPE6A), and 0.71 parts by weight of dispersing defoaming agent (manufactured by Sannopuko KK, product name: S-65) are input in the container, agitated and mixed to prepare a mixture composition. 1.8 parts by weight of benzophenone (manufactured by Kanto Chemical) serving as photoinitiator and 0.2 parts by weight of Michler's ketone (manufactured by Kanto Chemical) serving as photosensitizer are added to the mixture composition, thereby obtaining a solder resist composition adjusted to have a viscosity of 2.0 Pa·s at 25° C.

The viscosity is measured by using the No. 4 rotor of a B-type viscometer (manufactured by Tokyo Keiki, DVL-B type) when the velocity is 60 min-l, and using the No. 3 rotor thereof when the velocity is 6 min-l.

(17) Next, after the above-stated solder resist composition 70 is coated on each surface of the multilayer wiring board by a thickness of 20 μm, and dried under conditions of 70° C. for 20 minutes and 70° C. for 30 minutes (FIG. 4(C)), a photomask on which a pattern of solder resist opening portions are drawn and which has a thickness of 5 mm, is fixedly attached to each solder resist layer 70, exposed with ultraviolet rays of 1000 mJ/cm$^2$, and developed with a DMTG solution, thereby forming opening portions 71 having a diameter of 200 μm (FIG. 5(A)).

Further, heat treatments are conducted at 80° C. for 1 hour, at 100° C. for 1 hour, at 120° C. for 1 hour, and at 150° C. for 3 hours, respectively, to harden the solder resist layers, thus forming solder resist pattern layers each having opening portions and a thickness of 15 to 25 μm. As the solder resist composition, a commercially available solder resist composition can be also used.

(18) Next, the substrate having the solder resist layers 70 formed thereon is immersed in an electroless nickel plating solution containing nickel chloride ($2.3 \times 10^{-1}$ mol/l), sodium hypophosphite ($2.8 \times 10^{-1}$ mol/l) and sodium citrate ($1.6 \times 10^{-1}$ mol/l) and a pH of 4.5 for 20 minutes, thereby forming nickel plated layers 72 having a thickness of 5 μm in the opening portions 71. Further, the resultant substrate is immersed in an electroless gold plating solution containing potassium gold cyanide ($7.6 \times 10^{-3}$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l) at 80° C. for 7.5 minutes, thereby forming gold plated layers 74 each having a thickness of 0.03 μm on the respective nickel plated layers 72 (FIG. 5(B)). Alternatively, a single tin or noble metal (gold, silver, palladium, platinum or the like) layer may be formed in stead of the nickel-gold layers.

(19) Thereafter, tin-lead containing solder paste is printed on each opening 71 of the solder resist layer 70 on one surface of the substrate on which surface the IC chip is mounted, tin-antimony containing solder paste is further printed on each opening on the other surface of the substrate, and solder bumps (solder bodies) are formed by conducting reflow at 200° C., thereby manufacturing a multilayer printed wiring board including solder bumps 76U and 76D (FIG. 6).

The IC chip 90 is attached to the multilayer printed wiring board and chip capacitors 98 are mounted thereon through the solder bumps 76U. Further, the multilayer printed wiring board is attached to the daughter board 94 through the solder bumps 76D (FIG. 7).

Embodiment 1-2

A multilayer printed wiring board is manufactured in the same manner as that of Embodiment 1-1 described above with reference to FIG. 6 except for the following respects:

Thickness of conductor layers of a core substrate: 55 μm; thickness of a power supply layer of the core substrate: 55 μm; and thickness of conductor layers of interlayer insulating layers: 15 μm.

Embodiment 1-3

A multilayer printed wiring board is manufactured in the same manner as that of Embodiment 1-1 except. for the following respects:

Thickness of conductor layers of a core substrate: 75 μm; thickness of a power supply layer of the core substrate: 75 μm; and thickness of conductor layers of interlayer insulating layers: 15 μm.

Embodiment 1-4

A multilayer printed wiring board is manufactured in the same manner as that of Embodiment 1 except for the following respects:

Thickness of conductor layers of a core substrate: 180 μm; thickness of a power supply layer of the core substrate: 180 μm; and thickness of conductor layers of interlayer insulating layers: 6 μm.

Embodiment 1-5

A multilayer printed wiring board is manufactured in the same manner as that of Embodiment 1-1 except for the following respects:

Thickness of conductor layers of a core substrate: 18 μm; thickness of a power supply layer of the core substrate: 18 μm; and thickness of conductor layers of interlayer insulating layers: 15 μm.

In Embodiment 1, the conductor layer serving as the power supply layer of the core substrate and those of the interlayer insulating layers which satisfy 1<(thickness of conductor layer as power supply layer of core substrate/thickness of conductor layers of interlayer insulating layers)≦40 are set for appropriate examples of Embodiment 1 while those which satisfy (thickness of conductor layer as power supply layer of core substrate/thickness of conductor layers of interlayer insulating layers)≦1 are set for a comparative example. Furthermore, those which satisfy (thickness of conductor layer as power supply layer of core substrate/thickness of conductor layers of interlayer insulating layers)>40 are set for a reference example.

Embodiment 2

Ceramic Substrate

A multilayer printed wiring board according to Embodiment 2 will be described.

In Embodiment 1 described above with reference to FIG. 6, the core substrate is formed out of insulating resin. In Embodiment 2, by contrast, a core substrate is an inorganic hard substrate made of ceramic, glass, ALN, mullite or the like. Since the other constitutions are the same as those in Embodiment 1 described above with reference to FIG. 6, they will not be described and illustrated herein.

On the multilayer printed wiring board in Embodiment 2 similarly to Embodiment 1, the conductor layers 34P and 34P on the core substrate 30 and the conductor layers 24 in the core substrate are formed out of metal such as copper or tungsten and the conductor circuits 58 on the interlayer resin insulating layers 50 and the conductor circuits 158 on the interlayer resin insulating layers 150 are formed out of copper. This Embodiment 2 attains the same advantages as those of Embodiment 1. The conductor layers of the core substrate, the power supply layer thereof and the interlayer insulating layers are formed to have the same thicknesses as those of Embodiment 1. Further, in Embodiment 2, the conductor layer serving as the power supply layer of the core substrate and those of the interlayer insulating layers which satisfy 1<(thickness of conductor layer as power supply layer of core substrate/thickness of conductor layers of interlayer insulating layers)≦40 are set for appropriate examples of Embodiment 1 while those which satisfy (thickness of conductor layer as power supply layer of core substrate/thickness of conductor layers of interlayer insulating layers)≦1 are set for a comparative example. Furthermore, those which satisfy (thickness of conductor layer as power supply layer of core substrate/thickness of conductor layers of interlayer insulating layers)>40 are set for a reference example.

Embodiment 2-1

A multilayer printed wiring board is manufactured in the same manner as that of Embodiment 2 stated above except for the following respects:

Thickness of conductor layers of a core substrate: 30 μm; thickness of a power supply layer of the core substrate: 30 μm; and thickness of conductor layers of interlayer insulating layers: 15 μm.

Embodiment 2-2

A multilayer printed wiring board is manufactured in the same manner as that of Embodiment 2 stated above except for the following respects:

Thickness of conductor layers of a core substrate: 50 μm; thickness of a power supply layer of the core substrate: 50 μm; and thickness of conductor layers of interlayer insulating layers: 15 μm.

Embodiment 2-3

A multilayer printed wiring board is manufactured in the same manner as that of Embodiment 2 stated above except for the following respects:

Thickness of conductor layers of a core substrate: 75 μm; thickness of a power supply layer of the core substrate: 75 μm; and thickness of conductor layers of interlayer insulating layers: 15 μm.

Embodiment 2-4

A multilayer printed wiring board is manufactured in the same manner as that of Embodiment 2 stated above except for the following respects:

Thickness of conductor layers of a core substrate: 180 μm; thickness of a power supply layer of the core substrate: 180 μm; and thickness of conductor layers of interlayer insulating layers: 6 μm.

Embodiment 3

Metal Core Substrate

A multilayer printed wiring board according to Embodiment 3 will be described with reference to FIGS. 8 and 9.

In Embodiment 1 described above with reference to FIG. 6, the core substrate is formed out of a resin board. In Embodiment 3, by contrast, a core substrate is formed out of a metallic plate.

Figure 8:
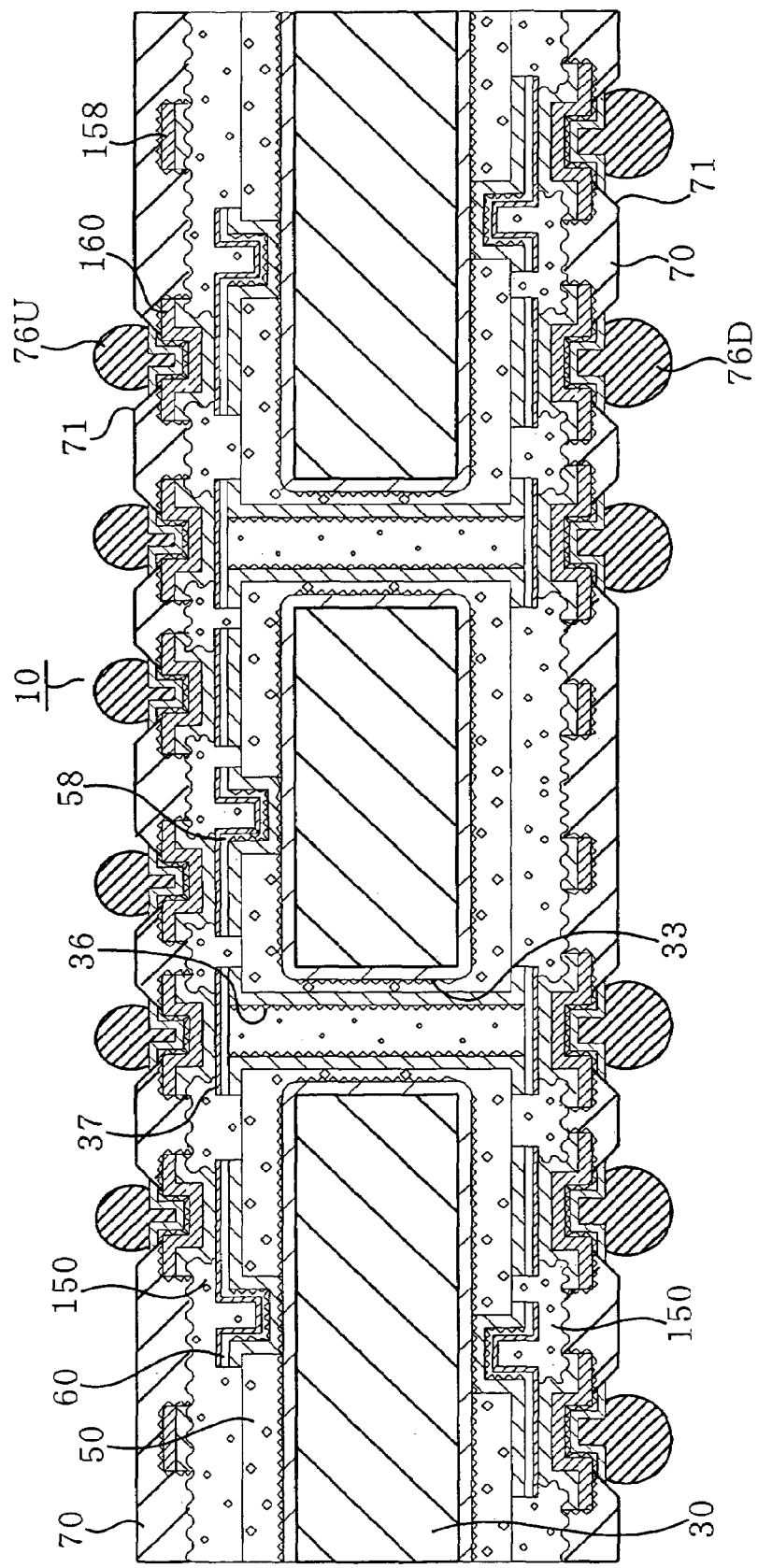
FIG. 8 is a cross-sectional view of the multilayer printed wiring board according to Embodiment 3.
Figure 9:
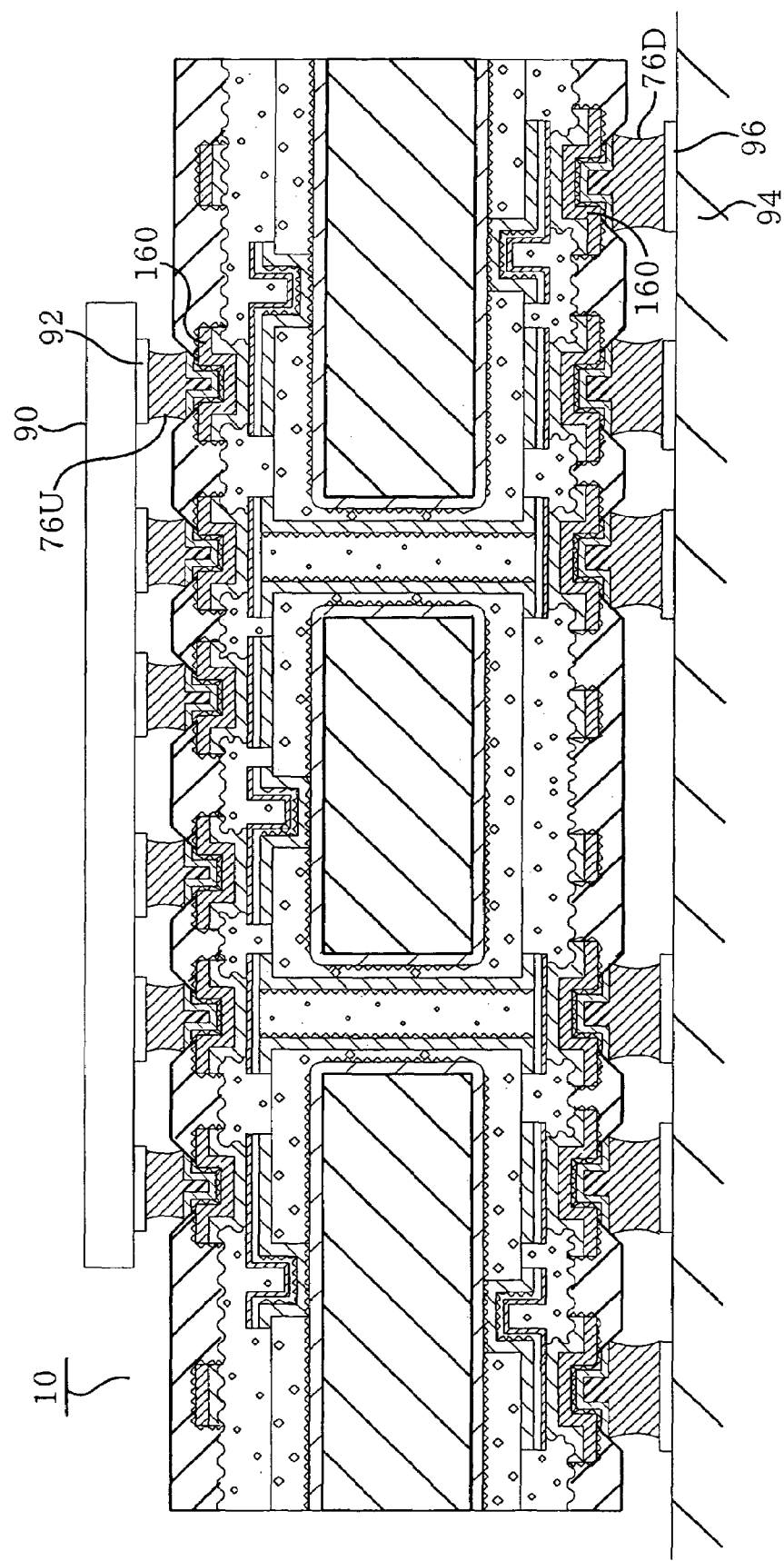
FIG. 9 is a cross-sectional view showing a state in which an IC chip is mounted on the multilayer printed wiring board according to Embodiment 3.

FIG. 8 shows the cross section of the multilayer printed wiring board 10 according to Embodiment 3 and FIG. 9 shows a state in which an IC chip 90 is attached to the multilayer printed wiring board 10 shown in FIG. 8 and in which the board 10 is mounted on a daughter board 94.

As shown in FIG. 8, the core substrate 30 of the multilayer printed wiring board 10 is made of a metallic plate and used as a power supply layer. Interlayer resin insulating layers 50 on which via holes 60 and conductor circuits 58 are arranged are formed on the both surfaces of the core substrate 30, respectively and interlayer resin insulating layers 150 on which via holes 160 and conductor circuits 158 are arranged are formed on the respective interlayer resin insulating layers 50. In the pass-through holes 33 of the core substrate 30, through holes 36 are formed, and cover plating layers 37 are arranged on the both ends of the via holes. Solder resist layers 70 are formed on the upper layers of the via holes 160 and the conductor circuit 158 and bumps 76U and 76D are formed on the via holes 160 and the conductor circuits 158 through the opening portions 71 of the solder resist layers 70, respectively.

As shown in FIG. 9, solder bumps 76U on the upper surface of the multilayer printed wiring board 10 are connected to lands 92 of the IC chip 90. Further, chip capacitors 98 are mounted on the board 10. Solder bumps 76D on the lower surface thereof are connected to lands 96 of the daughter board 94.

Here, the core substrate 30 is formed to have a thickness of 200 to 600 μm. The metallic plate is formed to have a thickness between 15 and 300 μm. The conductor layers of the interlayer resin insulating layers may be formed to have a thickness between 5 and 25 μm. However, the thickness of the metallic layer may exceed the above range.

Embodiment 3 attains the same advantages as those of Embodiment 1.

Embodiment 3-1

A multilayer printed wiring board is formed in the same manner as Embodiment 3 described above with reference to FIG. 8 except for the following respects:

Thickness of a core substrate: 550 μm; thickness of a power supply layer of the core substrate: 35 μm; and thickness of conductor layers of interlayer insulating layers: 15 μm.

Embodiment 3-2

A multilayer printed wiring board is formed in the same manner as Embodiment 3 except for the following respects:

Thickness of a core substrate: 600 μm; thickness of a power supply layer of the core substrate: 55 μm; and thickness of conductor layers of interlayer insulating layers: 15 μm.

Embodiment 3-3

A multilayer printed wiring board is formed in the same manner as Embodiment 3 except for the following respects:

Thickness of a core substrate: 550 μm; thickness of a power supply layer of the core substrate: 100 μm; and thickness of conductor layers of interlayer insulating layers: 10 μm.

Embodiment 3-4

A multilayer printed wiring board is formed in the same manner as Embodiment 3 except for the following respects:

Thickness of a core substrate: 550 μm; thickness of a power supply layer of the core substrate: 180 μm; and thickness of conductor layers of interlayer insulating layers: 6 μm.

Embodiment 3-5

A multilayer printed wiring board is formed in the same manner as Embodiment 3 except for the following respects:

Thickness of a core substrate: 550 μm; thickness of a power supply layer of the core substrate: 240 μm; and thickness of conductor layers of interlayer insulating layers: 6 μm.

In Embodiment 3, the conductor layer serving as the power supply layer of the core substrate and those of the interlayer insulating layers which satisfy 1<(thickness of conductor layer as power supply layer of core substrate/thickness of conductor layers of interlayer insulating layers)≦40 are set for appropriate examples of Embodiment 3 while those which satisfy (thickness of conductor layer as power supply layer of core substrate/thickness of conductor layers of interlayer insulating layers)≦1 are set for a comparative example. Furthermore, those which satisfy (thickness of conductor layer as power supply layer of core substrate/thickness of conductor layers of interlayer insulating layers)>40 are set for a reference example.

Embodiment 4

Multilayer Core Substrate

A multilayer printed wiring board according to Embodiment 4 will be described with reference to FIGS. 10 and 11.

In Embodiment 1 described above with reference to FIG. 6, the core substrate comprises a single board. In Embodiment 4, by contrast, a core substrate comprises multilayer boards and conductor layers are provided in the multilayer boards.

Figure 10:
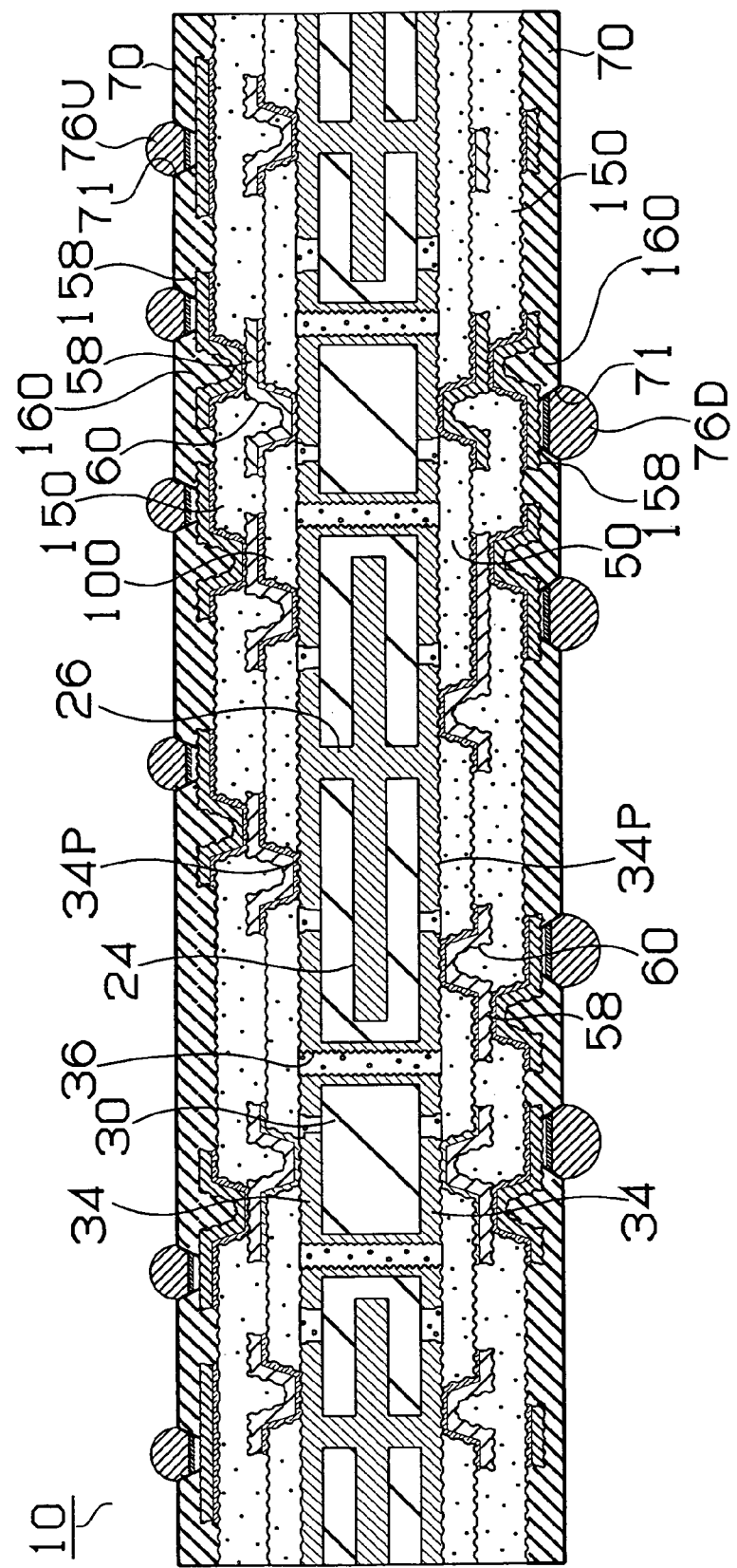
FIG. 10 is a cross-sectional view of a multilayer printed wiring board according to Embodiment 4.

FIG. 10 shows the cross section of the multilayer printed wiring board 10 according to Embodiment 4 and FIG. 11 shows a state in which an IC chip 90 is attached to the multilayer printed wiring board 10 shown in FIG. 10 and in which the board 10 is mounted on a daughter board 94. As shown in FIG. 10, on the multilayer printed wiring board 10, conductor circuits 34 and conductor layers 34P are formed on the front and rear surfaces of the core substrate 30, respectively and conductor layers 24 are formed in the core substrate 30. The conductor layers 34P and 24 are formed as power supply plane layers. The conductor layers 34P and 24 are connected to one another by conductive posts 26. (The conductive posts mean herein via holes such as through holes or non-through holes (including blind through holes and blind via holes) or holes filled with through hole or via hole conductive material.) In addition, an interlayer resin insulating layer 50 on which via holes 60 and conductor circuits 58 are formed and an interlayer resin insulating layer 150 on which via holes 160 and conductor circuits 158 are formed are provided on each of the conductor layers 34P. Solder resist layers 70 are formed on upper layers of the via holes 160 and the conductor circuits 158, and bumps 76U and 76D are formed on the via holes 160 and the conductor circuits 158 through the opening portions 71 of the solder resist layers 70, respectively.

As shown in FIG. 11, solder bumps 76U on the upper surface of the multilayer printed wiring board 10 are connected to lands 92 of the IC chip 90. Further, chip capacitors 98 are mounted on the board 10. Solder bumps 76D on the lower surface thereof are connected to lands 96 of the daughter board 94. Here, the conductor circuits 34 and the conductor layers 34P, 34P on the core substrate 30 and the conductor layers 24 in the core substrate are formed and conductor circuits 58 on interlayer resin insulating layers 50 and conductor circuits 158 on interlayer resin insulating layers 150 are formed. The conductor layers 34P and 24 of the core substrate are formed to have thicknesses between 1 and 250 μm and the conductor layers formed on the core substrate and serving as the power supply layers are formed to have a thickness between 1 and 250 μm. The thickness of each conductor layer in this case is the sum of the thicknesses of the power supply layers of the core substrate. This means that the thickness of the conductor layer is the sum of the thickness of the conductor layer 34 on the inner layer and that of the conductor layer 24 on the surface layer. This does not mean that the thicknesses of the layers serving as signal lines are added together. In Embodiment 4, by summing the thicknesses of the three conductor layers 34P, 34P and 24, the same advantages as those of Embodiment 1 are attained. The thickness of the power supply layers may exceed the above range.

In Embodiment 4, the conductor layer serving as the power supply layer of the core substrate and those of the interlayer insulating layers which satisfy 1<(sum of thickness of conductor layer as power supply layer of core substrate/thickness of conductor layers of interlayer insulating layers)≦40 are set for appropriate examples of Embodiment 4 while those which satisfy (sum of thickness of conductor layer as power supply layer of core substrate/thickness of conductor layers of interlayer insulating layers)≦1 are set for a comparative example. Furthermore, those which satisfy (sum of thickness of conductor layer as power supply layer of core substrate/thickness of conductor layers of interlayer insulating layers)>40 are set for a reference example.

Embodiment 4-1

A multilayer printed wiring board is formed in the same manner as that of Embodiment 4 stated above with reference to FIG. 10 except for the following respects:

Thickness of conductor layers (power supply layers) of the core substrate: 15 μm Thicknesses of intermediate conductor layers (power supply layers): 20 μm Sum of thicknesses of power supply layers of the core substrate: 50 μm Thickness of conductor layers of interlayer insulating layers: 15 μm.

Embodiment 4-2

A multilayer printed wiring board is formed in the same manner as that of Embodiment 4 except for the following respects.

Thickness of conductor layers (power supply layers) of the core substrate: 20 μm Thicknesses of intermediate conductor layers (power supply layers): 20 μm Sum of thicknesses of power supply layers of the core substrate: 60 μm Thickness of conductor layers of interlayer insulating layers: 15 μm.

Embodiment 4-3

A multilayer printed wiring board is formed in the same manner as that of Embodiment 4 except for the following respects.

Thickness of conductor layers (power supply layers) of the core substrate: 25 μm Thicknesses of intermediate conductor layers (power supply layers): 25 μm Sum of thicknesses of power supply layers of the core substrate: 75 μm Thickness of conductor layers of interlayer insulating layers: 15 μm.

Embodiment 4-4

A multilayer printed wiring board is formed in the same manner as that of Embodiment 4 except for the following respects.

Thickness of conductor layers (power supply layers) of the core substrate: 50 μm Thicknesses of intermediate conductor layers (power supply layers): 100 μm Sum of thicknesses of power supply layers of the core substrate: 200 μm Thickness of conductor layers of interlayer insulating layers: 10 μm.

Embodiment 4-5

A multilayer printed wiring board is formed in the same manner as that of Embodiment 4 except for the following respects.

Thickness of conductor layers (power supply layers) of the core substrate: 55 μm Thicknesses of intermediate conductor layers (power supply layers): 250 μm Sum of thicknesses of power supply layers of the core substrate: 360 μm Thickness of conductor layers of interlayer insulating layers: 12 μm.

Embodiment 4-6

A multilayer printed wiring board is formed in the same manner as that of Embodiment 4 except for the following respects.

Thickness of conductor layers (power supply layers) of the core substrate: 55 μm Thicknesses of intermediate conductor layers (power supply layers): 250 μm Sum of thicknesses of power supply layers of the core substrate: 360 μm Thickness of conductor layers of interlayer insulating layers: 9 μm.

Embodiment 5

Multilayer Core Substrate

Figure 19:
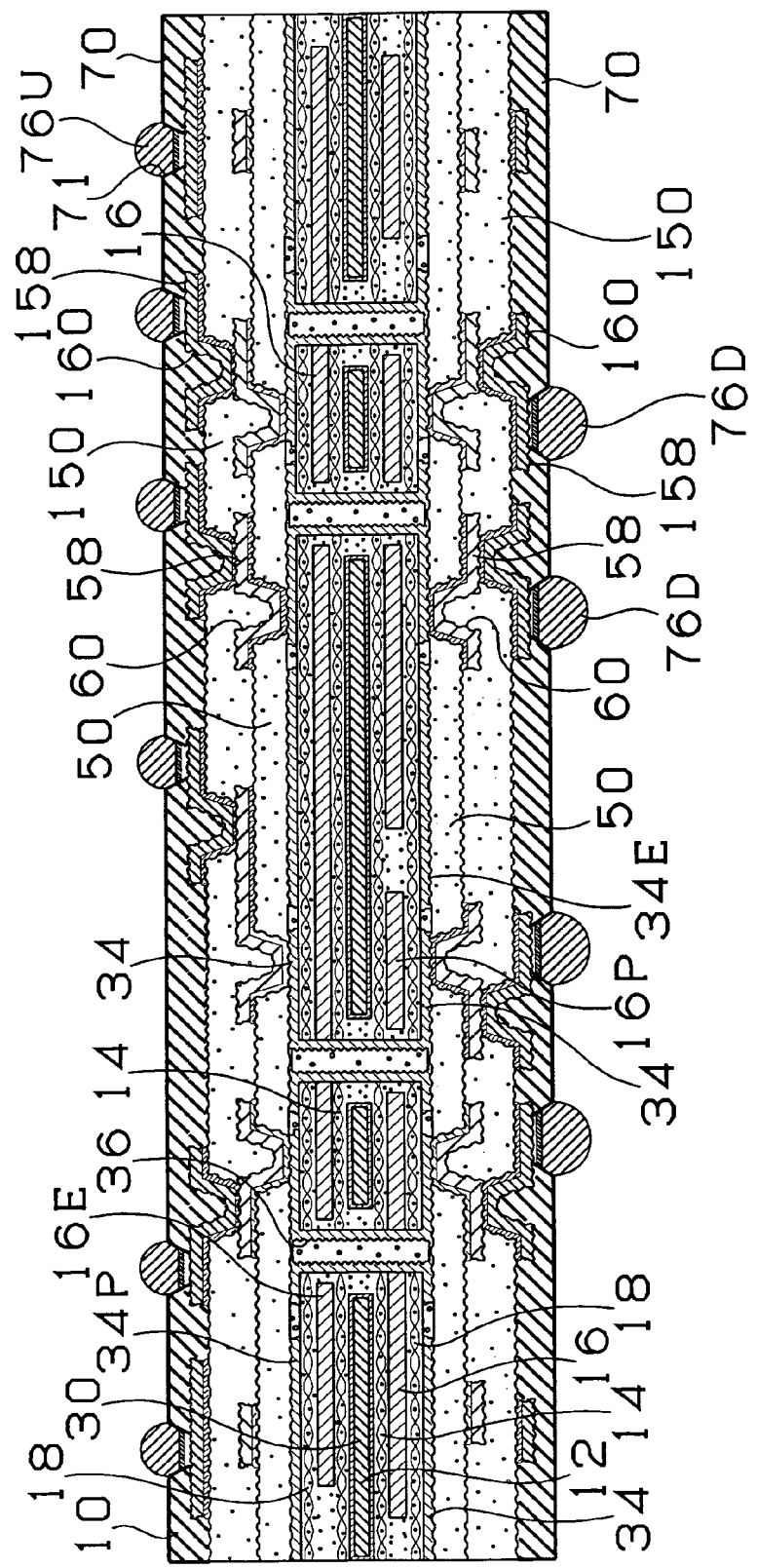
FIG. 19 is a cross-sectional view of the multilayer printed wiring board according to Embodiment 5.
Figure 20:
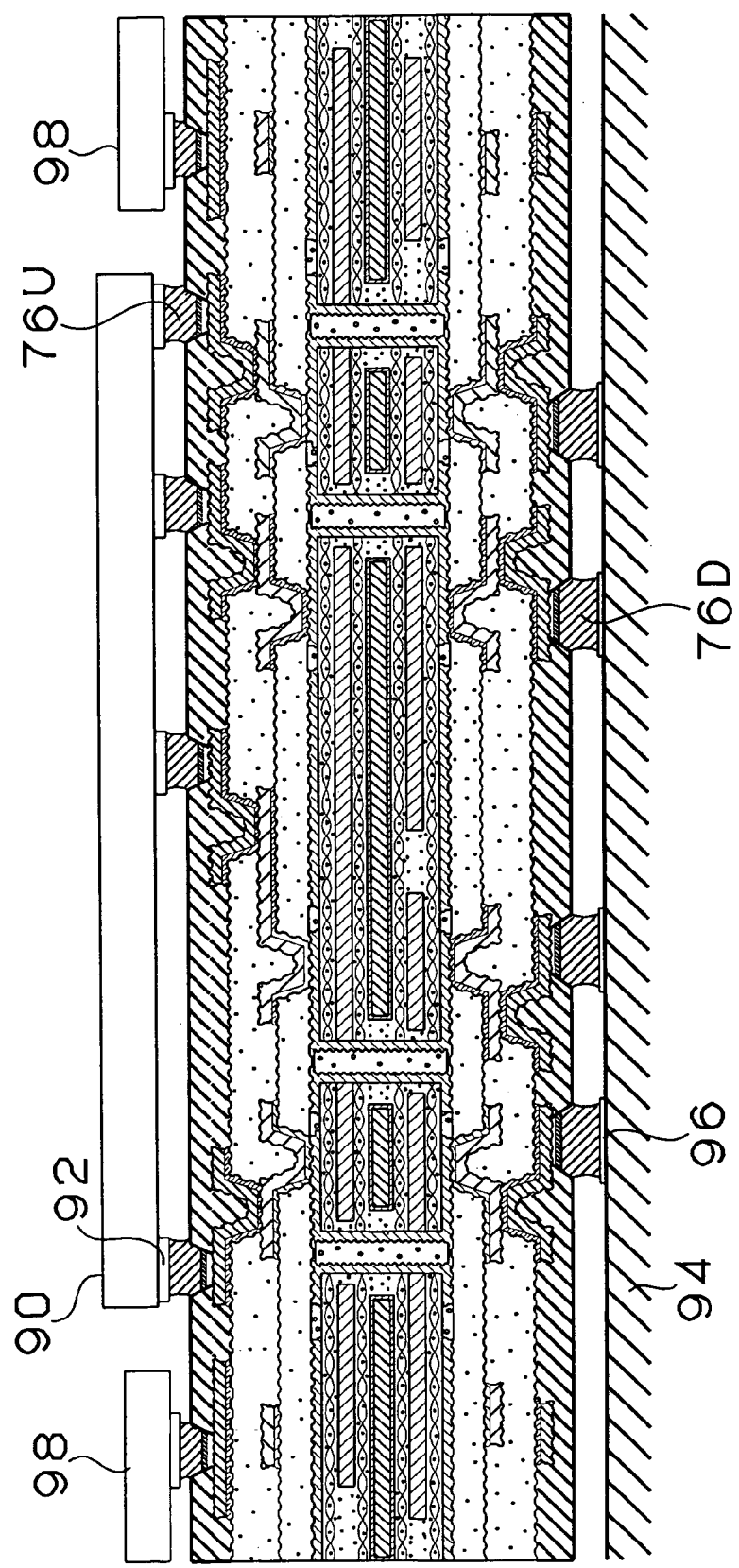
FIG. 20 is a cross-sectional view showing a state in which an IC chip is mounted on the multilayer printed wiring board according to Embodiment 5.

A multilayer printed wiring board according to Embodiment 5 of the present invention will be described with reference to FIGS. 10 to 11. The configuration of a multilayer printed wiring board 10 according to Embodiment 5 will first be described with reference to FIGS. 19 and 20. FIG. 19 shows the cross section of the multilayer printed wiring board 10 and FIG. 20 shows a state in which an IC chip 90 is attached to the multilayer printed wiring board 10 shown in FIG. 19 and in which the board 10 is mounted on a daughter board 94. As shown in FIG. 19, a multilayer printed wiring board 10 employs a multilayer core substrate 30. A conductor circuit 34 and a conductor layer 34P are formed on the front surface of the multilayer core substrate 30 and a conductor circuit 34 and a conductor layer 34E are formed on the rear surface thereof. The upper conductor layer 34P is formed as a power supply plane layer while the lower conductor layer 34E is formed as an earth plane layer. Further, a conductor circuit 16 and a conductor layer 16E on the inner layer are formed on the inside surface of the multilayer core substrate 30 while a conductor circuit 16 and a conductor layer 16P are formed on the inside rear surface thereof. The upper conductor layer 16E is formed as an earth plane layer while the lower conductor layer 16P is formed as a power supply plane layer. Connection to the power supply plane layer is established by through holes or via holes. The plane layer may comprise a single layer formed on one side or comprise two or more layers. Preferably, the plane layer comprises two to four layers. Since it is not confirmed that the plane layer comprising four or more plane layers can improve electric characteristic, the electric characteristic of the plane layer comprising four or more layers is the same as that of the plane layer comprising four layers. Particularly if the plane layer comprising two layers, the expansion ratios of the substrate can be made uniform and warps less occur in terms of the rigidity matching of the multilayer core substrate. An electrically insulated metallic plate 12 is contained at the center of the multilayer core substrate 30. (Although the metallic plate 12 serves as a central material, it is not electrically connected to the through holes, via holes and the like. The metallic plate 12 mainly serves to improve the rigidity of the substrate 30 against warps.) A conductor circuit 16 and a conductor layer 16E are formed on the metallic plate 12 on the front surface side of the substrate 30 through an insulating resin layer 14 and a conductor circuit 16 and a conductor layer 16P are formed on the metallic plate 12 on the rear surface side of the substrate 30 through an insulating resin layer 14. Further, a conductor circuit 34 and a conductor layer 34P are formed on the metallic plate 12 on the front surface side of the substrate 30 through an insulating resin layer 18 and a conductor circuit 34 and a conductor layer 34E are formed on the metallic plate 12 on the rear surface side of the substrate 30 through an insulating resin layer 18. The front surface side and the rear surface side of the multilayer core substrate 30 are connected to each other via through holes 36.

Interlayer resin insulating layers 50 on which via holes 60 and conductor circuits 58 are formed and interlayer resin insulating layers 150 on which via holes 160 and conductor circuits 158 are formed are arranged on the conductor layers 34P and 34E on the surfaces of the multilayer core substrate 30, respectively. Solder resist layers 70 are formed on the upper layers of the via holes 160 and the conductor circuits 158 and bumps 76U and 76D are formed on the via holes 160 and the conductor circuits 158 through the opening portions 71 of the solder resist layers 70, respectively.

As shown in FIG. 20, solder bumps 76U on the upper surface of the multilayer printed wiring board 10 are connected to lands 92 of the IC chip 90. Further, chip capacitors 98 are mounted on the board 10. External terminals 76D on the lower surface thereof are connected to lands 96 of the daughter board 94. External terminals refer herein to PGA's, BGA's, solder bumps or the like.

The conductor layers 34P and 34E on the front layers of the core substrate 30 are formed to have thicknesses of 10 to 60 μm, the conductor layers 16P and 16E are formed on the inner layer to have thicknesses of 10 to 250 μm, the conductor circuits 58 on the interlayer resin insulating layers 50 and the conductor circuits 158 on the interlayer resin insulating layers 150 are formed to have thicknesses of 10 to 25 μm.

On the multilayer printed wiring board according to Embodiment 5, the power supply layer (conductor layer) 34P on the surface layer of the core substrate 30, the conductor layers 34, the power supply layer (conductor layer) 16P on the inner layer of the core substrate 30, the conductor layer 16E and the metallic plate 12 are made thick, thereby intensifying the strength of the core substrate. As a result, even if the core substrate itself is formed thin, it is possible for the substrate itself to relax warps and generated stresses.

Furthermore, by making the conductor layers 34P and 34E and conductor layers 16P and 16E thick, it is possible to increase the volumes of the conductors themselves. By increasing the volumes, it is possible to decrease the resistance of the conductors.

In addition, by employing the conductor layers 34P and 16P as power supply layers, it is possible to improve the capability of supplying power to the IC chip 90. Due to this, if the IC chip is mounted on the multilayer printed wiring board, it is possible to decrease a loop inductance of the IC chip—the substrate—the power supply. Accordingly, power shortage in an initial operation is decreased to make it difficult to cause power shortage. Even if the IC chip in a higher frequency range is mounted on the multilayer printed wiring board, malfunction, error or the like does not occur in the initial operation. Besides, by employing the conductor layers 34E and 16E as earth layers, noise does not superpose on the signal of the IC chip and the supply of power to the IC chip, thus making it possible to prevent malfunction or error. By mounting capacitors, the power accumulated in the capacitors can be used as auxiliary power, making it difficult to cause power shortage. By providing the capacitors right under the IC chip, in particular, the effect (of making it difficult to cause power shortage) becomes conspicuous. This is because the capacitors right under the IC chip enables shortening wiring lengths on the multilayer printed wiring board.

In Embodiment 5, the multilayer core substrate 30 has the thick conductor layers 16P and 16E on the inner layer and the thin conductor layers 34P and 34E on the surface of the substrate 30, and the inner layer conductor layers 16P and 16E and the surface layer conductor layers 34P and 34E are employed as the power supply conductor layers and the earth conductor layers, respectively. Namely, even if the thick conductor layers 16P and 16E are arranged on the inner layer side of the substrate 30, the resin layers covering the conductor layers are formed. Due to this, it is possible to cancel irregularities derived from the conductor layers and thereby flatten the surface of the multilayer core substrate 30. Therefore, even if the thin conductor layers 34P and 34E are arranged on the surfaces of the multilayer core substrate 30 so as not to generate waviness on the conductor layers 58 and 158 of the respective interlayer resin insulating layers 50 and 150, it is possible to secure sufficient thickness as that of the conductor layers of the core by the sum of the thicknesses of the conductor layers 16P and 16E on the inner layer. Since no waviness occurs, no problem occurs to the impedances of the conductor layers on the interlayer insulating layers. By employing the conductor layers 16P and 34P as the power supply conductor layers and the conductor layers 16E and 34E as the earth conductor layers, it is possible to improve the electric characteristics of the multilayer printed wiring board.

Furthermore, by arranging the signal line 16 between the conductor layers 34P and 16P (on the same layer as that of the conductor layer 16E) in the core substrate, it is possible to form a micro-strip structure. Likewise, by arranging the signal line 16 between the conductor layers 16E and 34E (on the same layer as that of the conductor layer 16P), it is possible to form a micro-strip structure. By forming the micro-strip structures, it is possible to decrease inductance and to match impedances to one another. Due to this, it is possible to stabilize the electric characteristics of the multilayer printed wiring board.

That is to say, the thicknesses of the conductor layers 16P and 16E on the inner layer of the core substrate are set larger than those of the conductor layers 58 and 158 on the interlayer insulating layers 50 and 150. By doing so, even if the thin conductor layers 34E and 34P are arranged on the surfaces of the multilayer core substrate 30, it is possible to secure sufficient thickness as that of the conductor layers of the core by adding the thicknesses of the thick conductor layers 16P and 16E on the inner layer. The thickness ratio of the conductor layers preferably satisfies 1<(conductor layer on inner layer of core/conductor layer of insulating layer)≦40. More preferably, the thickness ratio satisfies 1.2≦(conductor layer on inner layer of core/conductor layer of insulating layer)≦30.

The multilayer core substrate 30 is constituted so that the conductor layers 16P and 16E as inner layer is formed on each surface of an electrically isolated metallic plate 12 through a resin layer 14 and so that the conductor layers 34P and 34E on the surface layer is formed outside of the conductor layers 16P and 16E as the inner layer through the resin layer 18. By arranging the electrically insulated metallic plate 12 on the central portion of the substrate, it is possible to secure sufficient mechanical strength. Further, by forming the conductor layers 16P and 16E on the inner layer of the both surfaces of the metallic plate 12 through the resin layers 14, respectively and the conductor layers 34P and 34E on the surface layer on the outside of the conductor layers 16P and 16E as the inner layer on the both surfaces of the metallic plate 12 through the resin layers 18, respectively, it is possible to impart symmetry to the both surfaces of the metallic plate 12 and to prevent the occurrence of warps, waviness and the like in a heat cycle and the like.

Figure 21:
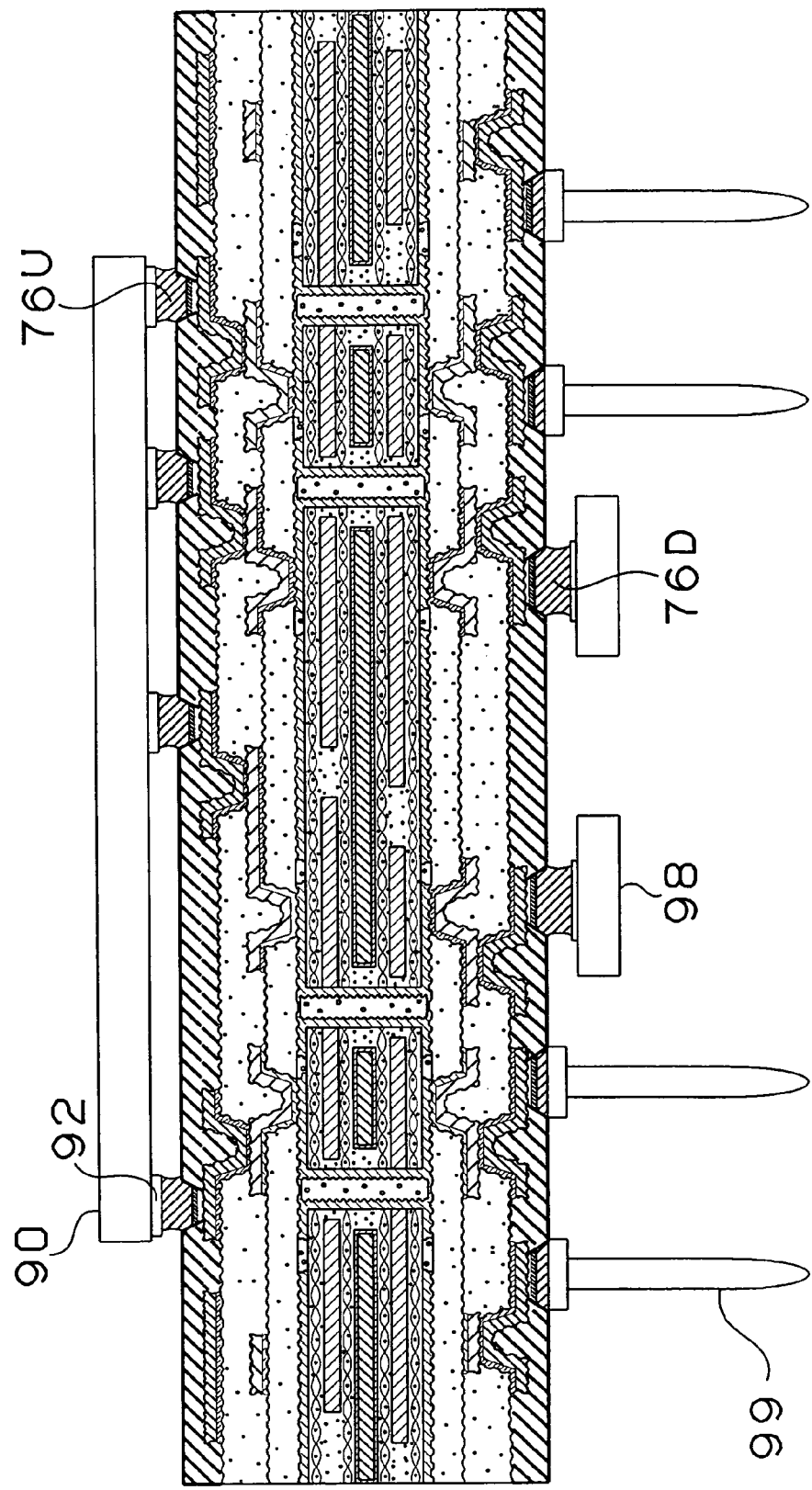
FIG. 21 is a cross-sectional view showing a state in which an IC chip is mounted on a multilayer printed wiring board according to a modification of Embodiment 5.

FIG. 21 shows a modification of Embodiment 5. In this modification, capacitors 98 are arranged right under the IC chip 90. Due to this, the distance between the IC chip 90 and the capacitor 98 is short, making it possible to prevent the voltage drop of the power supplied to the IC chip 90.

Next, a method for manufacturing the multilayer printed wiring board 10 shown in FIG. 19 will be described with reference to FIGS. 12 to 18.

(1) Formation of Metallic Layer

Openings 12a are provided in an inner layer metallic layer (metallic plate) 12 having a thickness of 50 to 400 μm as shown in FIG. 12(A) to penetrate the front and rear surfaces of the layer 12 (FIG. 12(B)). As the material of the metallic layer, a material containing a mixture of copper, nickel, zinc, aluminum, iron and the like can be used. The openings 12a are formed by punching, etching, drilling, a laser or the like. Depending on cases, metallic films 13 may be coated on the entire surfaces of the metallic layer 12 having the openings 12a formed therein by electroplating, electroless plating, substitutional plating or sputtering (FIG. 12(C)). The metallic plate 12 may comprise a single layer or a plurality of layers of two or more layers. In addition, the metallic films 13 preferably have curves formed on the corners of the openings 12a. The curves can eliminate points at which stresses are concentrated and make it more difficult to cause defects such as cracks and the like around the points.

(2) Formation of Insulating Layers on Inner Layer

Insulating resin is used to cover the entire surfaces of the metallic layer 12 and fill up the openings 12a. For example, the metallic plate 12 is put between resin films in a B stage state of a thickness of about 30 to 200 μm, the resin films are thermally pressed and hardened, whereby insulating rein layers 14 can be formed (FIG. 12(D)). Depending on cases, the insulating rein layers 14 may be formed out of films after applying resin, applying resin and press-fitting the resin films or applying the resin only to the opening portions.

As the material of the insulating resin layers 14, a prepreg having a core material such as glass cloth impregnated with thermosetting resin such as polyimide resin, epoxy resin, phenol resin or BT resin is preferable. The other resin may be used.

(3) Bonding of Metallic Foils

Metallic layers 16α on the inner layer are formed on the both surfaces of the metallic layer 12 covered with the resin layers 14, respectively (FIG. 12(E)). By way of example, metallic foils having a thickness of 12 to 275 μm are built on the both surfaces thereof. As an alternative to the method for forming the metallic foils, a one-sided copper-clad laminate is built up on each surface of the metallic layer 12. The laminate can be formed on the metallic foils by plating or the like.

(4) Formation of Circuits of Metallic Layer on the Inner Layer

Two or more layers may be formed. The metallic layer may be formed by the additive method.

Through a denting method, etching steps and the like, conductor layers 16, 16P and 16E on the inner layer are formed from the inner layer metallic layer 16α (FIG. 12(F)). The inner layer conductor layers are formed to have thicknesses of 10 to 250 μm. Alternatively, the thicknesses may exceed the range.

(5) Formation of Insulating Layers as Outer Layers

Insulating resin is used to cover the entire surfaces of the inner layer conductor layers 16, 16P and 16E and fill up the gaps between the circuits of outer layer metal. By way of example, outer layer insulating resin layers 18 are formed by putting the metallic plate between resin films in a B stage state of a thickness of about 30 to 200 μm, thermally press-fitting and hardening the resin films (FIG. 13(A)). Depending on cases, the outer layer insulating resin layers 18 may be formed out of films after applying resin, applying resin and press-fitting the resin films or applying the resin only to the opening portions. By applying pressure, it is possible to flatten the surfaces of the layers 18.

(6) Bonding of Outermost Layer Metallic Foils

Outermost metallic layers 34β are formed on the both surfaces of the substrate covered with the outer layer insulating resin layers 18 (FIG. 13(B)). By way of example, metallic foils having a thickness of 10 to 275 μm are built up on the both surfaces of the substrate. As an alternative to the method for forming the metallic foils, one-sided copper-clad laminates are built up. Two or more layers of the laminates may be formed on the metallic foils. The metallic layers may be formed by the additive method.

(7) Formation of Through Holes

Pass-through holes 36α for through holes having opening diameter of 50 to 400 μm are formed to penetrate the front and rear surfaces of the substrate (FIG. 13(C)). As a formation method, the holes are formed by drilling, a laser or a combination of drilling and the laser. (The holes are opened in the outermost insulating layers by the laser, and then maybe penetrated through the substrate by drilling while using the holes opened by the laser as target marks.) The forms of the holes are preferably those having linear sidewalls. Depending on cases, the holes may be tapered.

To secure the conductive properties of the through holes, it is preferable to form plated films 22 in the respective pass-through holes 36α for the through holes and roughen the surfaces of the plated films 22 (FIG. 13(D)), and then to fill the holes with resin filler 23 (FIG. 13(E)). As the resin filler, either an electrically insulated resin material (e.g., a resin material containing a resin component, hardening agent, particles and the like) or a conductive material holding electrical connection by metallic particles (e.g., a conductive material containing metallic particles such as gold or copper particles, a resin material, hardening agent and the like) can be used.

As plating, electroplating, electroless plating, panel plating (electroless plating and electroplating) or the like may be performed. The plated films 22 are formed by plating metals containing copper, nickel, cobalt, phosphorus or the like. The thicknesses of the plated metals are preferably 5 to 30 μm.

The resin filler 23 filled in the pass-through holes 36a for the through holes is preferably made of an insulating material comprising a resin material, hardening agent, particles and the like. As the particles, inorganic particles such as silica or alumina particles can be used solely, metallic particles such as gold, silver or copper particles can be used solely, resin particles can be used solely or the inorganic particles, the metallic particles and the resin particles can be mixed together. The particles equal in particle size from 0.1 to 5 μm or different in particle size from 0.1 to 5 μm can be mixed. As the resin material, thermosetting resin such as epoxy resin (e.g., bisphenol type epoxy resin or novolac type epoxy resin and the like) or phenol resin, ultraviolet setting resin having a photosensitive property, thermoplastic resin or the like may be used solely or mixed together. As the hardening agent, imidazole based hardening agent, amine based hardening agent or the like can be used. Alternatively, hardening agent containing hardening stabilizer, reaction stabilizer, particles and the like may be used. In the latter case, the resin filler is replaced by conductive paste made of a conductive material comprising metallic particles, a resin component, hardening agent and the like. Depending on cases, metallic films having a conductive property may be formed on the surface layers of an insulating material such as solder or insulating resin. It is also possible to fill the pass-through holes 36a for through holes with plated members. Since the conductive paste is hardened and contracted, depressed portions are sometimes formed on the surface layers.

(8) Formation of Outermost Layer Conductor Circuits

Cover plated members 25 may be formed right on the through holes 36 by coating plated films on the entire surfaces of the substrate (FIG. 14(A)). Thereafter, outer layer conductor circuits 34, 34P and 34E are formed through the denting method, etching steps and the like (FIG. 14(B)). As a result, the multilayer core substrate 30 is completed.

At this time, although not shown in the drawings, the electrical connection of the outer conductor circuits to inner conductor layers 16 and the like of the multilayer core substrate may be established by via holes, blind through holes or blind via holes.

Thereafter, similarly to Embodiment 1 described above with reference to FIGS. 1(C) to 5, interlayer resin insulating layers 50 and 150 and conductor circuits 58 and 158 are formed on the multilayer core substrate 30.

(9) The multilayer core substrate 30 on which the conductor circuits 34 have been formed thereon is subjected to a blackening treatment and a reduction treatment, thereby forming roughened surfaces 348 on the entire surfaces of the conductor circuits 34 and the conductor layers 34P and 34E (FIG. 14(C)).

(10) Layers of the resin filler 40 are formed on the conductor circuit unformed portions of the multilayer core substrate 30 (FIG. 15(A)).

(11) The one surface of the substrate which has been subjected to the above treatments is polished by belt sander polishing or the like so as not to leave the resin filler 40 on the outer edges of the conductor layers 34P and 34E, and then the entire surfaces of the conductor layers 34P and 34E (including the land surfaces of the through holes) are further polished by buffing or the like so as to eliminate scratches caused by the former polishing. A series of polishing operations are similarly conducted to the other surface of the substrate. Next, the resin filler 40 is hardened by heat treatments at 100° C. for 1 hour and 150° C. for 1 hour (FIG. 15(B)).

The resin filler may not be filled between the conductor circuits. In that case, using resin layers such as interlayer insulating layers, the insulating layers are formed and the portions between the conductor circuits are filled up.

(12) Etchant is sprayed onto the both surfaces of the multilayer core substrate 30 and the surfaces of the conductor circuits 34 and the conductor layers 34P and 34E and the land surfaces and inner walls of the through holes 36 are subjected to etching or the like, thereby forming roughened surfaces 36B on the entire surfaces of the conductor circuits (FIG. 15(C)).

(13) Resin films 50γ for interlayer resin insulating layers are mounted on the both surface of the multilayer core substrate 30, respectively, temporarily press-fitted and cut, and then bonded onto the substrate using the vacuum laminator, thereby forming interlayer resin insulating layers (FIG. 16(A)).

(14) Thereafter, through a mask having pass-through holes having a thickness of 1.2 mm formed therein, openings 50a for via holes are formed to have a diameter of 80 μm in the interlayer resin insulating layers 2 by a $CO_2$ gas laser having wavelength of 10.4 μm under conditions of a beam diameter of 4.0 mm, a top hat mode, a pulse width of 7.9 microseconds, the pass-through hole diameter of the mask of 1.0 mm and one shot (FIG. 16(B)).

(15) The multilayer core substrate 30 is immersed in a solution containing 60 g/l of permanganic acid at 80° C. for 10 minutes to form roughened surfaces 50α on the surfaces of the interlayer resin insulating layers 50 including the inner walls of the via hole openings 50a (FIG. 15(C)). The roughened surfaces are formed to have a thickness between 0.1 to 5 μm.

(16) Next, the multilayer core substrate 30 which has been subjected to the above-stated treatments is immersed in neutralizer (manufactured by Shipley Corporation) and then washed.

Further, a palladium catalyst is added to the surfaces of the roughened substrate (a roughening depth of 3 μm), thereby attaching catalyst nuclei to the surfaces of the interlayer resin insulating layers and the inner wall surfaces of the via hole openings.

(17) The substrate to which the catalyst is attached is immersed in an electroless copper plating aqueous solution and electroless copper plated films having a thickness of 0.6 to 3.0 μm are formed on the entire roughened surfaces, thereby obtaining the substrate having electroless copper plated films 52 formed on the surfaces of the interlayer resin insulating layers 50 including the inner walls of the via hole openings 50a (FIG. 15(D)).

(18) Commercially available dry films are bonded to the substrate on which electroless copper plated films 52 are formed, a mask is put on the substrate, the substrate is developed and plating resists 54 are thereby provided (FIG. 17(A)). The plating resists having a thickness of 10 to 30 μm are used.

(19) Next, the multilayer core substrate 30 is electroplated, thereby forming electroplated copper films 56 having a thickness of 5 to 20 μm are formed on portions in which the plating resists 54 are not formed, respectively (FIG. 17(B)).

(20) After peeling off the plating resists with 5% KOH, the electroless plated films under the plating resist are etched, molten and removed with a solution mixture of sulfuric acid and hydrogen peroxide, thus forming independent conductor circuits 58 and via holes 60 (FIG. 17(C)).

(21) Next, the same treatment as that of (12) is conducted to form roughened surfaces 58α and 60α on the surfaces of the conductor circuits 58 and via holes 60. The upper conductor circuits 58 are formed to have a thickness of 5 to 25 μm. In this example, the upper conductor circuits 58 have a thickness of 15 μm (FIG. 17(D)).

(22) The steps (14) to (21) stated above are repeated, thereby forming further upper layer conductor circuits and a multilayer wiring board is obtained (FIG. 18(A)).

(23) Next, after the above-stated solder resist composition 70 is coated on each surface of the multilayer wiring board by a thickness of 12 to 30 μm, and dried under conditions of 70° C. for 20 minutes and 70° C. for 30 minutes (FIG. 18(B)), a photomask on which a pattern of solder resist opening portions are drawn and which has a thickness of 5 mm, is fixedly attached to each solder resist layer 70, exposed with ultraviolet rays of 1000 mJ/cm$^2$, and developed with a DMTG solution, thereby forming opening portions 71 having a diameter of 200 μm (FIG. 18(C)). Further, heat treatments are conducted at 80° C. for 1 hour, at 100° C. for 1 hour, at 120° C. for 1 hour, and at 150° C. for 3 hours, respectively, to harden the solder resist layers, thus forming solder resist pattern layers each having opening portions and a thickness of 10 to 25 μm.

(24) Next, the substrate on which the solder resist layers 70 are formed is immersed in an electroless nickel plating solution, thereby forming nickel plated layers 72 having a thickness of 5 μm on the opening portions 71, respectively. Furthermore, the substrate is immersed in an electroless gold plating solution, thereby forming gold plated layers 74 having a thickness of 0.03 μm on the respective nickel plated layers 72 (FIG. 18(D)). Alternatively, a single tin or noble metal (gold, silver, palladium, platinum or the like) layer may be formed in stead of the nickel-gold layers.

(25) Thereafter, tin-lead containing solder paste is printed on each opening 71 of the solder resist layer 70 on one surface of the substrate on which surface the IC chip is mounted, tin-antimony containing solder paste is further printed on each opening on the other surface of the substrate, and external terminals are formed by conducting reflow at 200° C., thereby manufacturing a multilayer printed wiring board including solder bumps (FIG. 19).

The IC chip 90 is attached to the multilayer printed wiring board and chip capacitors 98 are mounted thereon through the external terminals 76U. Further, the multilayer printed wiring board is attached to the daughter board 94 through the solder bumps 76D (FIG. 20).

In Embodiment 5, the conductor layer serving as the power supply layer of the core substrate and those of the interlayer insulating layers which satisfy 1<(thickness of conductor layer as power supply layer/thickness of conductor layers of interlayer insulating layers)≦40 are set for appropriate examples of Embodiment 5 while those which satisfy (thickness of conductor layer as power supply layer/thickness of conductor layers of interlayer insulating layers)≦1 are set for a comparative example. Furthermore, those which satisfy (thickness of conductor layer as power supply layer/thickness of conductor layers of interlayer insulating layers)>40 are set for a reference example.

Embodiment 5-1

The multilayer printed wiring board is manufactured in the same manner as that of Embodiment 5 described above with reference to FIG. 19 except for the following respects:

Thickness of conductor layers on the inner layer of the core substrate: 50 μm; thickness of conductor layers as surface layers thereof: 20 μm;

Sum of the thicknesses of the conductor circuits of the core substrate: 100 μm

Thickness of the conductor layers of the interlayer insulating layers: 15 μm.

The conductor layers on the inner layer and those on the surface layer serve as power supply layers. However, the areas of the surface conductor layers are about those of the lands and smaller than those of the inner conductor layers, so that the effect of dropping power is cancelled. Due to this, the thicknesses of the two inner conductor layers are added to the thicknesses of the conductor layers of the core substrate.

Embodiment 5-2

The conductor layers on the inner layer and the conductor layers on the surface layer serve as power supply layers. One surface layer and one inner layer are electrically connected to each other by a through hole.

Thickness of conductor layers on the inner layer of the core substrate: 60 μm; thickness of conductor layers as surface layers thereof: 20 μm;

Sum of the thicknesses of the conductor circuits of the core substrate: 80 μm

Thickness of the conductor layers of the interlayer insulating layers: 15 μm.

One of the conductor layers on the inner layer and one of the conductor layers on the surface layer serve as one power supply layer. The areas of the conductor layers as the surface layers are equal to those of the conductor layers on the inner layer. The effect of dropping power is exhibited. Due to this, the sum of the thicknesses of the conductor layers of the core substrate is the sum of the thicknesses of the conductor layers on the inner layer and those as the surface layers.

Embodiment 5-3

The sum of the thicknesses of the conductor layers of the core substrate is the thickness of the conductor layer on the inner layer.

Thickness of conductor layers on the inner layer of the core substrate: 75 μm; thickness of conductor layers as surface layers thereof: 20 μm;

Sum of the thicknesses of the conductor circuits of the core substrate: 150 μm

Thickness of the conductor layers of the interlayer insulating layers: 15 μm.

The conductor layers on the inner layer and those on the surface layer serve as power supply layers. However, the areas of the surface conductor layers are about those of the lands and smaller than those of the inner conductor layers, so that the effect of dropping power is cancelled. Due to this, the sum of the thicknesses of the conductor circuits of the core substrate is the thicknesses of the one inner conductor layer the thicknesses of the two inner conductor layers are added to the thicknesses of the conductor layers of the core substrate.

Embodiment 5-4

A multilayer printed wiring board is formed in the same manner as that of Embodiment 5-3 except for the following respects.

Thickness of conductor layers on the inner layer of the core substrate: 200 μm; thickness of conductor layers as surface layers thereof: 20 μm;

Sum of the thicknesses of the conductor circuits of the core substrate: 200 μm

Thickness of the conductor layers of the interlayer insulating layers: 10 μm.

The sum of the thicknesses of the conductor circuits of the core substrate is the sum of the thicknesses of the conductor layers on the inner layer.

Embodiment 5-5

A multilayer printed wiring board is formed in the same manner as that of Embodiment 5-3 except for the following respects.

Thickness of conductor layers on the inner layer of the core substrate: 240 μm; thickness of conductor layers as surface layers thereof: 20 μm;

Sum of the thicknesses of the conductor circuits of the core substrate: 240 μm

Thickness of the conductor layers of the interlayer insulating layers: 8 μm.

The sum of the thicknesses of the conductor circuits of the core substrate is the sum of the thicknesses of the conductor layers on the inner layer.

Embodiment 5-6

A multilayer printed wiring board is formed in the same manner as that of Embodiment 5-3 except for the following respects.

Thickness of conductor layers on the inner layer of the core substrate: 250 μm; thickness of conductor layers as surface layers thereof: 25 μm;

Sum of the thicknesses of the conductor circuits of the core substrate: 300 μm

Thickness of the conductor layers of the interlayer insulating layers: 7.5 μm.

Embodiment 6

Capacitor Included Core Substrate

A multilayer printed wiring board according to Embodiment 6 will be described with reference to FIGS. 22 and 23.

On the multilayer printed wiring board according to Embodiment 6, chip capacitors 20 are included in the core substrate 30.

Figure 22:
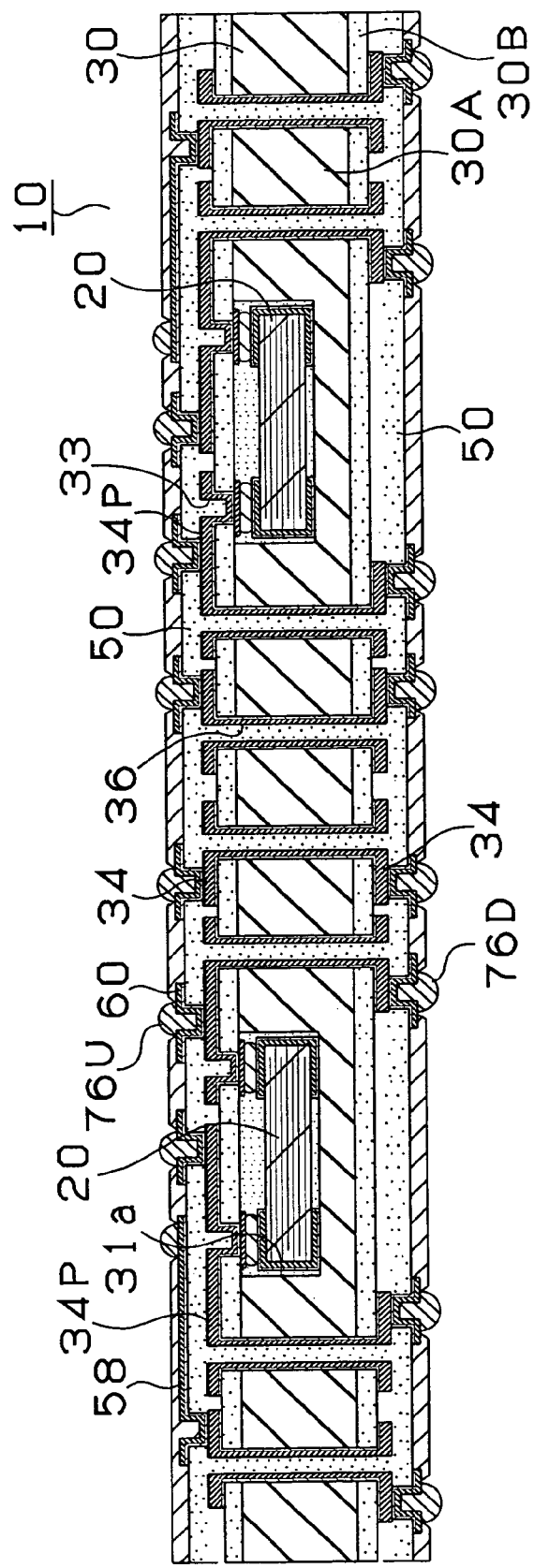
FIG. 22 is a cross-sectional view of the multilayer printed wiring board according to Embodiment 6.
Figure 23:
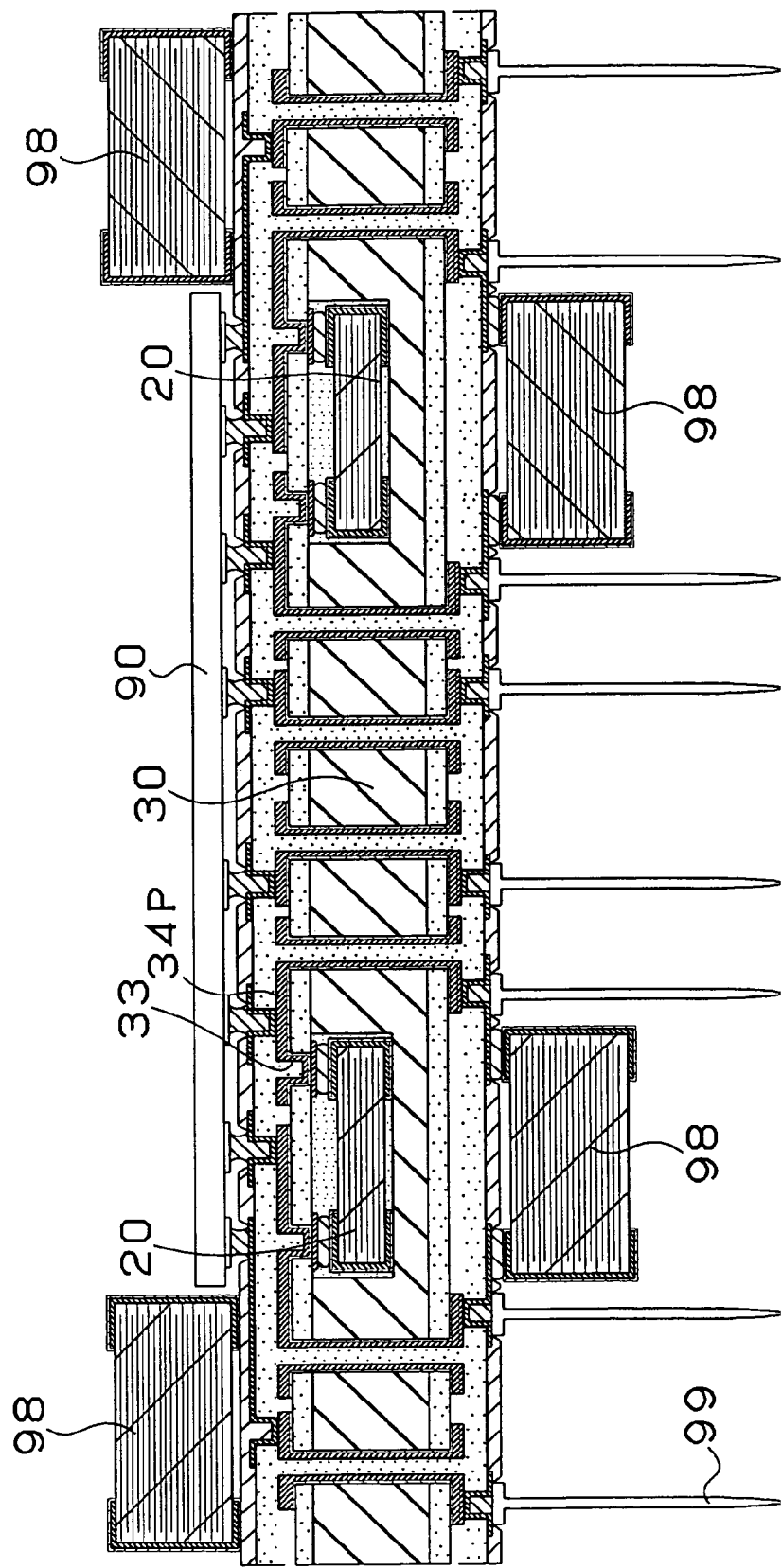
FIG. 23 is a cross-sectional view showing a state in which an IC chip is mounted on a multilayer printed wiring board according to a modification of Embodiment 6.
Figure 24:
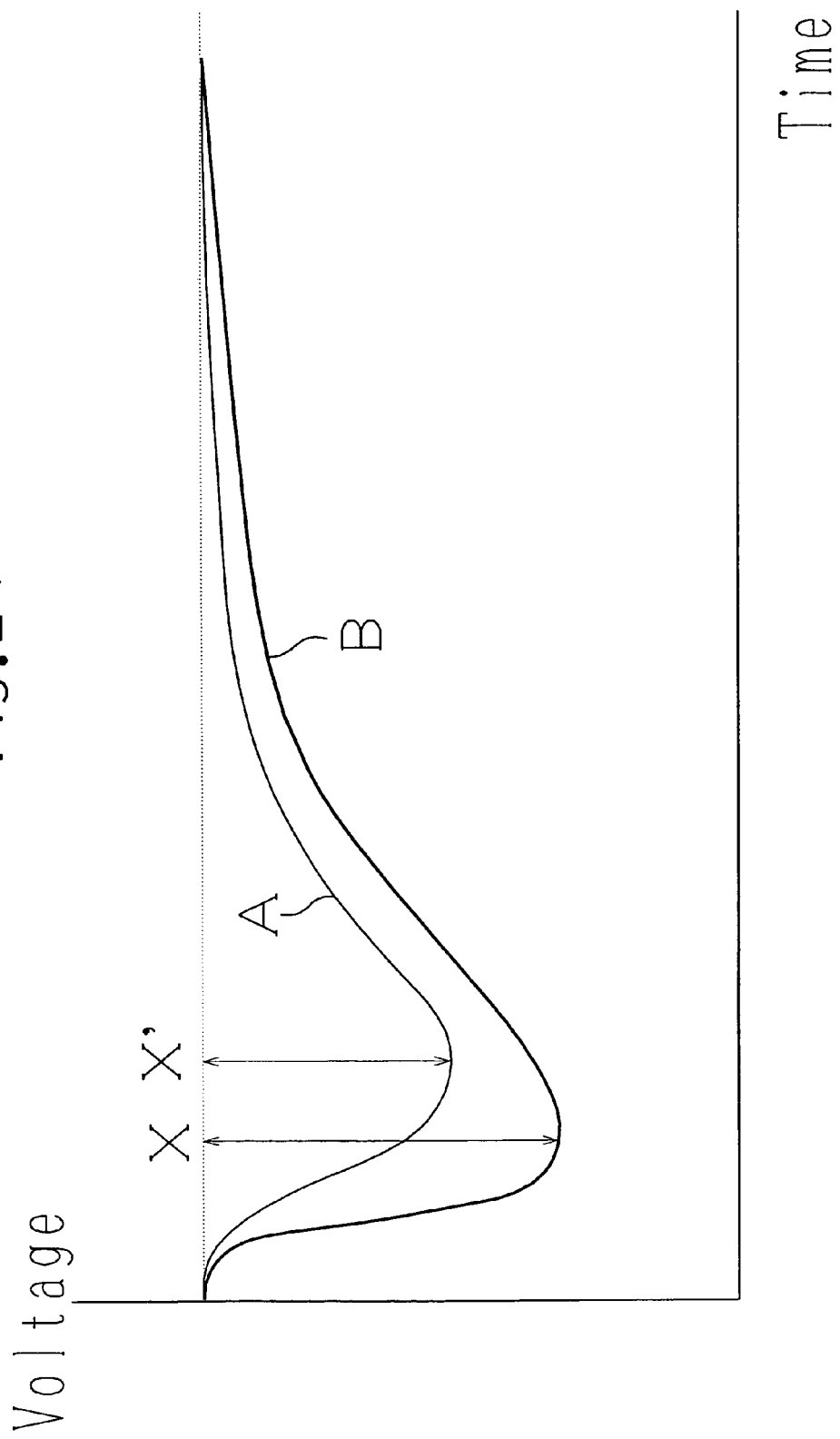
FIG. 24 is a graph showing voltage change during the operation of the IC chip.

FIG. 22 is a cross-sectional view of the multilayer printed wiring board 10 according to Embodiment 6 and FIG. 23 shows a state in which the IC chip 90 is attached to the multilayer printed wiring board 10 shown in FIG. 22. As shown in FIG. 22, the core substrate 30 of the multilayer printed wiring board 10 comprises a resin substrate 30A and resin layers 30B. The resin substrate 30A is provided with openings 31a for containing the capacitors 20, respectively. The electrodes of the capacitors 20 are connected to one another by via holes 33 provided in the resin layer 30B. A conductor layer 34P for forming conductor circuits 34 and a power supply layer is formed on the upper surface of the core substrate 30, and interlayer resin insulating layers 50 on which via holes 60 and conductor circuit 58 are arranged are formed on the both surfaces of the core substrate 30, respectively. Through holes 36 are formed in the core substrate 30. Solder resist layers 70 are formed on the upper layers of the respective interlayer resin insulating layers 50 and bumps 76U and 76D are formed on the via holes 160 and the conductor circuits 158 through the opening portions 71 of the solder resist layers 70, respectively.

As shown in FIG. 23, solder bumps 76U on the upper surface of the multilayer printed wiring board 10 are connected to lands 92 of the IC chip 90. Further, chip capacitors 98 are mounted on the board 10. On the other hand, conductive connection pins 99 for the connection of the core substrate 30 to lower solder bumps are attached to the core substrate 30.

The conductor layer 34E is formed to have a thickness of 30 μm. Since the capacitors 20 are included in the core substrate 30 according to Embodiment 6, Embodiment 6 can attain more advantages than those of Embodiment 1.

Embodiment 6-1

A multilayer printed wiring board is manufactured in the same manner as that of Embodiment 6 described above with reference to FIG. 22 except for the following respects:

Thickness of the conductor layers of the core substrate: 30 μm; thickness of the power supply layer of the core substrate: 30 μm; thickness of the conductor layer of the interlayer insulating layer: 15 μm.

Embodiment 6-2

A multilayer printed wiring board is manufactured in the same manner as that of Embodiment 6 except for the following respects:

Thickness of the conductor layers of the core substrate: 55 μm; thickness of the power supply layer of the core substrate: 55 μm; thickness of the conductor layer of the interlayer insulating layer: 15 μm.

Embodiment 6-3

Thickness of the conductor layers of the core substrate: 75 μm; thickness of the power supply layer of the core substrate: 75 μm; thickness of the conductor layer of the interlayer insulating layer: 15 μm.

Embodiment 6-1

A multilayer printed wiring board is manufactured in the same manner as that of Embodiment 6-1 except for the following respects:

Thickness of the conductor layers (power supply layer) of the core substrate: 180 μm; thickness of the conductor layer of the interlayer insulating layer: 6.0 μm.

COMPARISON EXAMPLE

In a comparison example for Embodiments 1 to 5, the thickness of the power supply layer of the core substrate and that of the conductor layer of the interlayer insulating layer are set to satisfy (thickness of power supply layer of core substrate/thickness of conductor layer of interlayer insulating layer)$\leq 1$. As an actual example of the comparison example, the thickness of the power supply layer of the core substrate is set at 15 μm and that of the conductor layer of the interlayer insulating layer is set at 15 μm.

REFERENCE EXAMPLE

In a reference example for Embodiments 1 to 5, the thickness of the power supply layer of the core substrate and that of the conductor layer of the interlayer insulating layer are set to satisfy (thickness of power supply layer of core substrate/ thickness of conductor layer of interlayer insulating layer)

≦40. As an actual example of the reference example, the thickness of the power supply layer of the core substrate is set at 415 μm and that of the conductor layer of the interlayer insulating layer is set at 10 μm.

The reference example means an example which can attain the same advantages as those of the appropriate examples; however, to which defects may possibly occur and which slightly inappropriate as compared with the appropriate examples.

IC chips with a frequency of 3.1 GHz are mounted on the substrate according to the embodiments, the comparison example and the reference examples, respectively, power equal in quantity is supplied to the respective chips, the voltage drop quantities of the power supplied to the respective IC chips when the chips are actuated are measured. The averages of the voltage drop quantities are shown. The averages are those of the voltage drop quantities varied at a power supply voltage of 1.0 V.

In addition, reliability tests are conducted to the embodiments, comparison example and reference example, respectively, under bias high temperature, high humidity conditions (130, humidity of 85 wt % and application of 2 V). The tests are conducted for test time of 100 hrs, 300 hrs, 500 hrs and 1000 hrs, respectively, to inspect the presence/absence of IC malfunction and the presence/absence of via connection opens in the conductor layers of the core for the embodiments, comparison example and reference example, respectively. Test results are shown on tables of FIGS. 27 and 28.

Figure 29:
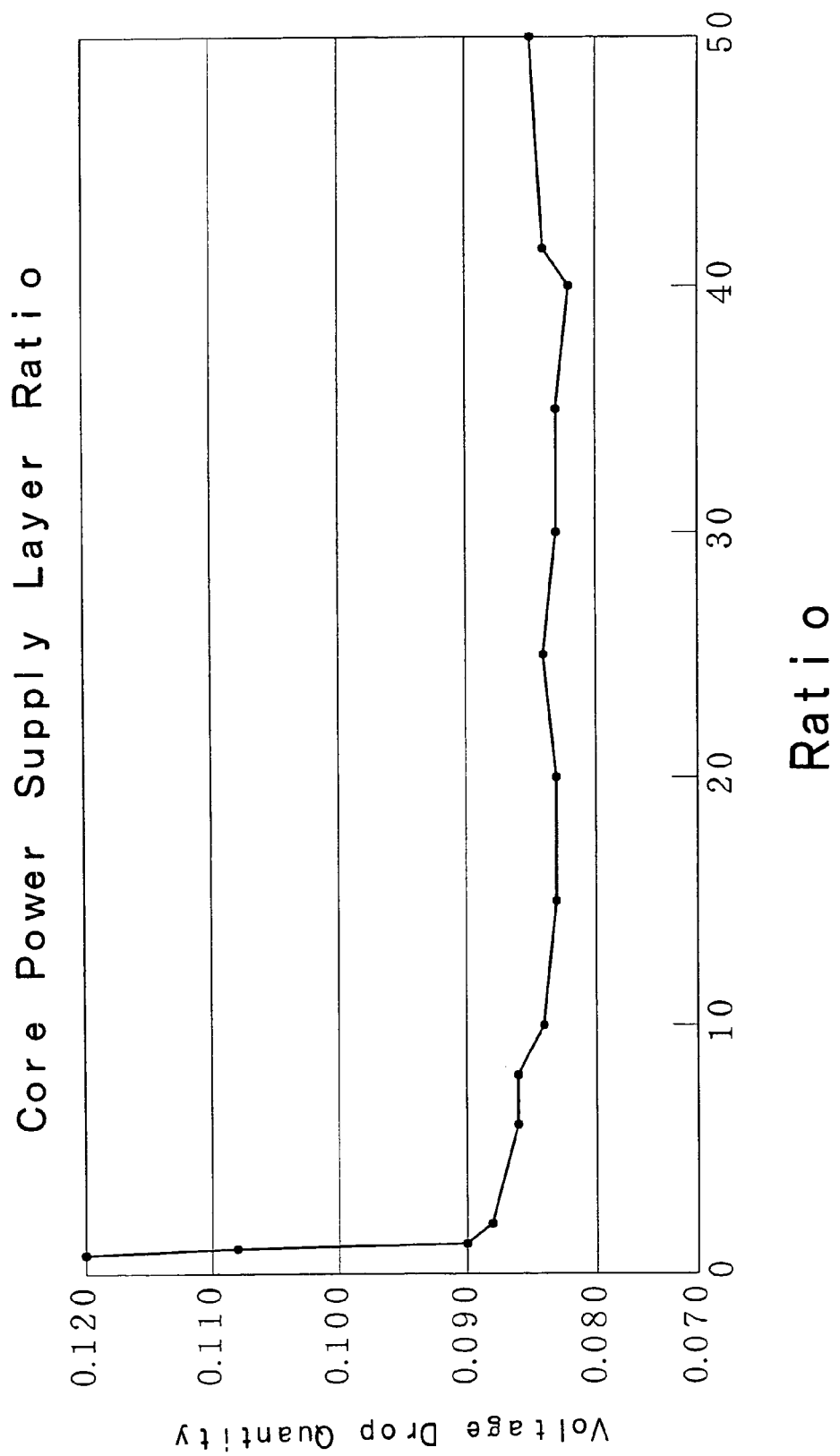
FIG. 29 is a graph showing the result of simulating a maximum voltage drop quantity (V) for (a ratio of thickness of power supply layer of core/thickness of interlayer insulating layer)

Further, the thicknesses of the conductor layers are inspected. A simulation result is shown in FIG. 29 with the horizontal axis set at (ratio of thickness of power supply layer of core/thickness of interlayer insulating layer) and the vertical axis set at maximum voltage drop quantity (V).

The graph is made based on the measurement results of all the embodiments, comparison example and reference example while the other points are made by simulation.

FIGS. 27 and 28 demonstrate that the multilayer printed wiring boards manufactured in the appropriate embodiments is less prone to the malfunction of the IC chip and opens. Namely, electrical connection and reliability are ensured according to the embodiments.

In the comparison example, the malfunction of the IC chip occurs, so that electrical connection involves a disadvantage. In addition, because of the thin conductors, the stresses generated under the reliability tests cannot be buffered and cracks occur to the via connection portions. As a result, reliability is deteriorated. However, if the ratio of the thickness of the power supply layer of the core substrate/the thickness of the conductor layer of the interlayer insulating layer exceeds 1.2, the effect of the thickness ratio appears.

If the ratio of the thickness of the power supply layer of the core substrate/the thickness of the conductor layer of the interlayer insulating layer exceeds 40 (in the reference example), reliability is deteriorated due to the defects of the upper conductor circuits (e.g., the generation of stresses to the upper conductor layers, the lowering of adhesion due to waviness and the like). Although no problem normally occurs, the tendency appears depending on the factors such as materials.

The test results demonstrate that the thickness of the power supply layer of the core substrate and that of the conductor layer of the interlayer insulating layer which satisfy the electrical characteristics are those which satisfy 1<(thickness of power supply layer of core substrate/thickness of conductor layer of interlayer insulating layer). In addition, those which satisfy the factors of the electrical characteristics and reliability are those which satisfy (thickness of power supply layer of core substrate/thickness of conductor layer of interlayer insulating layer)≦40.

The results shown in FIGS. 27 and 28 demonstrate as follows. If the power supply voltage is 1.0 V and a variation allowable range is ±10%, the behavior of the voltage is stable and the malfunction of the IC chip does not occur. Namely, in this case, if the voltage drop quantity is within 0.1 V, the malfunction of the IC chip or the like due to the voltage drop does not occur. If the voltage drop quantity is within 0.09 V, reliability improves. For these reasons, it is preferable that the ratio of the thickness of the power supply layer of the core substrate/the thickness of the conductor layer of the interlayer insulating layer exceeds 1.2. In addition, if the ratio is 1.2=(thickness of power supply layer of core substrate/thickness of conductor layer of interlayer insulating layer)≦40, the value tends to decrease, so that the advantage can be easily attained. Further, if the ratio is 40≦(thickness of power supply layer of core substrate/thickness of conductor layer of interlayer insulating layer), the voltage drop quantity rises, which follows that a problem occurs to voltage supply due to the via separation at the core portion or the like. If the via separation is suppressed by selecting materials or the like, the problem can be solved. The problem is not serious in an ordinary range.

Furthermore, if the ratio is 5.0<(thickness of power supply layer of core substrate/thickness of conductor layer of interlayer insulating layer)≦40, the voltage drop quantities are almost the same and voltage behavior is, therefore, stable. In other words, this range is the most preferable ratio range.

According to this invention, it is possible to decrease the resistances of the conductors of the IC chip, the substrate and the power supply and thereby decrease transmission loss. Due to this, a signal and power to be transmitted exhibit desired capabilities. Accordingly, the IC chip normally functions and operates and no malfunction or error occurs to the IC chip. It is possible to decrease the resistances of the conductors of the IC chip, the substrate and the earth, decrease the superposition of noise on the signal line and power supply line and prevent malfunction or error.

Moreover, it becomes clear that it is possible to decrease the degree of power shortage (voltage drop) which occurs at the initial startup of the IC chip according to this invention and that even if an IC chip in a high frequency range, particularly an IC chip with 3 GHz or higher, the IC chip can be started without causing any problems. It is thereby possible to improve the electrical characteristics and electrical connection characteristics.

Additionally, the resistances in the circuits of the printed wiring board can be decreased as compared with those of the conventional printed wiring board. Due to this, even if a reliability test with the application of a bias under high temperature, high humidity conditions (high temperature, high humidity bias test) is conducted, destruction time is lengthened, making it possible to also improve reliability.

What is claimed is:

1. A multilayer printed wiring board comprising:
   a core substrate;
   a first conductor layer having a plurality of conductor circuits formed on said core substrate;
   an interlayer insulating layer formed over said first conductor layer and said core substrate;
   a second conductor layer having a plurality of conductor circuits formed on said interlayer insulating layer; and a via hole structure electrically connecting one of said conductor circuits of said first conductor layer and one of said conductor circuits of said second conductor layer, wherein said first conductor layer on said core substrate has a thickness which is larger than a thickness of said second conductor layer on said interlayer insulating layer, and wherein said thickness of said first conductor layer on said core substrate is $\alpha 1$, said thickness of said second conductor layer on said interlayer insulating layer is $\alpha 2$, and $\alpha 1$ and $\alpha 2$ satisfy $\alpha 2 < \alpha 1 < 40 \alpha 2$.

2. The multilayer printed wiring board according to claim 1, wherein said thickness of said first conductor layer on said core substrate is $\alpha 1$, said thickness of said second conductor layer on said interlayer insulating layer is $\alpha 2$, and said $\alpha 1$ satisfies $2\alpha 2 < \alpha 1 < 40 \alpha 2$.

3. The multilayer printed wiring board according to claim 1, wherein the first conductor layer on said core substrate comprises a power supply layer or an earth.

4. The multilayer printed wiring board according to claim 1, further comprising a capacitor mounted over said second conductor layer.

5. A multilayer printed wiring board comprising:
a core substrate comprising a multilayer core substrate comprising not less than three layers including at least one inner conductor layer having a plurality of conductor circuits;
a conductor layer having a plurality of conductor circuits formed over said core substrate;
an interlayer insulating layer formed over said conductor layer and said core substrate; and
a through hole structure formed through said interlayer insulating layer and electrically connecting one of said conductor circuits of said at least one inner conductor layer and one of said conductor circuits of said conductor layer formed over said core substrate, wherein the at least one inner conductor layer of said core substrate and the conductor layer over said core substrate include a power supply layer or an earth, wherein said at least one inner conductor layer of said core substrate comprises the power supply layer or the earth, and said conductor layer is formed on a surface of said core substrate and comprises a signal line, and wherein the at least one inner conductor layer of said core substrate has a thickness which is larger than a thickness of the conductor layer formed over the surface of said core substrate.

6. The multilayer printed wiring board according to claim 5, wherein the at least one inner conductor layer of said core substrate comprises not less than two inner conductor layers.

7. The multilayer printed wiring board according to claim 5, wherein said core substrate comprises an electrically isolated metallic plate, and a plurality of insulating layers formed on surfaces of said electrically isolated metallic plate, respectively, said at least one inner conductor layer of said core substrate comprises a plurality of inner conductor layers, and the inner conductor layers are formed on the insulating layers, respectively.

8. The multilayer printed wiring board according to claim 5, wherein the conductor layer is formed on a surface of said core substrate, and said at least one inner layer of said core substrate has a thickness which is larger than a thickness of the conductor layer formed on the surface of said core substrate.

9. The multilayer printed wiring board according to claim 1, wherein the first conductor layer formed on said core substrate comprises a power supply layer or an earth.

10. The multilayer printed wiring board according to claim 1, further comprising a capacitor mounted over a surface of said core substrate.

11. A multilayer printed wiring board according to claim 5, wherein said at least one inner layer of said core substrate has a thickness which is larger than a thickness of the conductor layer formed on said core substrate.

12. The multilayer printed wiring board according to claim 5, wherein said at least one inner conductor layer of said core substrate comprises not less than two inner conductor layers.

13. The multilayer printed wiring board according to claim 5, wherein said core substrate comprises an electrically isolated metallic plate and a plurality of insulating layers formed on surfaces of said electrically isolated metallic plate, respectively, said at least one inner conductor layer of said core substrate comprises a plurality of inner conductor layers, and the inner conductor layers are formed on the insulating layers, respectively.

14. The multilayer printed wiring board according to claim 5, further comprising a second conductor layer having a plurality of conductor circuits formed over said interlayer insulating layer, wherein said conductor layer is formed on a surface of said core substrate, said at least one inner layer of said core substrate has a thickness which is larger than a thickness of the conductor layer formed on the surface of said core substrate, and the thickness of said conductor layer formed on the surface of said core substrate is larger than a thickness of said second conductor layer.

15. A multilayer printed wiring board comprising:
a core substrate; and
a multilayered structure formed on said core substrate and including a first conductor layer having a plurality of conductor circuits formed on said core substrate, at least one interlayer insulating layer formed over said first conductor layer, and a second conductor layer having a plurality of conductor circuits formed on said at least one interlayer insulating layer, wherein said first conductor layer on said core substrate has a thickness which is larger than a thickness of said second conductor layer on said at least one interlayer insulating layer, and wherein said thickness of said first conductor layer on said core substrate is $\alpha 1$, said thickness of said second conductor layer on said interlayer insulating layer is $\alpha 2$, and $\alpha 1$ and $\alpha 2$ satisfy $\alpha 2 < \alpha 1 < 40 \alpha 2$.

16. The multilayer printed wiring board according to claim 15, wherein said thickness of said first conductor layer on said core substrate is $\alpha 1$, said thickness of said second conductor layer on said interlayer insulating layer is $\alpha 2$, and said $\alpha 1$ satisfies $2\alpha 2 < \alpha 1 < 40 \alpha 2$.

* * * * *